(12) United States Patent
Zhou et al.

(10) Patent No.: US 11,050,508 B2
(45) Date of Patent: Jun. 29, 2021

(54) DATA TRANSMISSION METHOD AND APPARATUS

(71) Applicant: Huawei Technologies Co., Ltd., Shenzhen (CN)

(72) Inventors: Yue Zhou, Hangzhou (CN); Rong Li, Hangzhou (CN); Gongzheng Zhang, Hangzhou (CN); Yinggang Du, Shenzhen (CN); Jun Wang, Hangzhou (CN)

(73) Assignee: Huawei Technologies Co, , Ltd., Shenzhen (CN)

( * ) Notice: Subject to any disclaimer, the term of this patent is extended or adjusted under 35 U.S.C. 154(b) by 40 days.

(21) Appl. No.: 16/522,386

(22) Filed: Jul. 25, 2019

(65) Prior Publication Data
US 2019/0349128 A1 Nov. 14, 2019

Related U.S. Application Data

(63) Continuation of application No. PCT/CN2018/072903, filed on Jan. 16, 2018.

(30) Foreign Application Priority Data

Jan. 25, 2017 (CN) .......................... 201710061380.3

(51) Int. Cl.
*H04L 1/00* (2006.01)
*H03M 13/13* (2006.01)

(52) U.S. Cl.
CPC .......... *H04L 1/0057* (2013.01); *H03M 13/13* (2013.01); *H04L 1/0063* (2013.01)

(58) Field of Classification Search
CPC ................. H04L 1/0057; H04L 1/0063; H04L 1/0061; H04L 1/0072; H04L 1/0041; H03M 13/13
See application file for complete search history.

(56) References Cited

U.S. PATENT DOCUMENTS

2014/0173376 A1 6/2014 Jeong et al.
2016/0218743 A1 7/2016 Li et al.
(Continued)

FOREIGN PATENT DOCUMENTS

CN 103825669 A 5/2014
CN 105337696 A 2/2016
(Continued)

OTHER PUBLICATIONS

"Details of the Polar code design," 3GPP TSG RAN WG1 Meeting #87, Reno, USA, R1-1611254, pp. 1-15, 3rd Generation Partnership Project, Valbonne, France (Nov. 10-14, 2016).
"Polar Code Construction for NR," 3GPP TSG RAN WG1 Meeting #86bis, Lisbon, Portugal, R1-1608862, pp. 1-8, 3rd Generation Partnership Project, Valbonne, France (Oct. 10-14, 2016).
(Continued)

*Primary Examiner* — Thien Nguyen
(74) *Attorney, Agent, or Firm* — Leydig, Voit & Mayer, Ltd.

(57) ABSTRACT

This application provides a polar code encoding method and apparatus. The method includes: segmenting, by a sending device, a to-be-encoded sequence according to a preset rule; determining a quantity of parity check frozen bits, locations of the parity check frozen bits, a quantity of information bits, locations of the information bits, a quantity of frozen bits, and locations of the frozen bits in each segment; then placing the information bits and the frozen bits at the corresponding locations; determining values of the parity check frozen bits; then performing polar code encoding on the to-be-encoded sequence; and sending an encoded sequence. According to this method, a process of determining the quantity of parity check frozen bits and the locations of the parity check frozen bits is simplified, thereby effectively improving processing efficiency.

20 Claims, 8 Drawing Sheets

(56) References Cited

U.S. PATENT DOCUMENTS

| | | | | |
|---|---|---|---|---|
| 2016/0285479 | A1* | 9/2016 | El-Khamy | H03M 13/616 |
| 2017/0005753 | A1* | 1/2017 | Shen | H04L 1/1819 |
| 2017/0019214 | A1* | 1/2017 | Shen | H04L 1/0067 |
| 2017/0047947 | A1* | 2/2017 | Hong | H03M 13/2906 |
| 2017/0222757 | A1* | 8/2017 | Huang | H03M 13/13 |
| 2017/0244429 | A1* | 8/2017 | Hof | H03M 13/134 |
| 2019/0312679 | A1* | 10/2019 | Jayasinghe | H03M 13/095 |

FOREIGN PATENT DOCUMENTS

| | | |
|---|---|---|
| CN | 106230555 A | 12/2016 |
| CN | 107124188 A | 9/2017 |

OTHER PUBLICATIONS

"Design aspects of Polar Code and LDPC for NR," 3GPP TSG RAN WG1 Meeting #86bis, Lisbon, Portugal, R1-1608865, pp. 1-7, 3rd Generation Partnership Project, Valbonne, France (Oct. 10-14, 2016).

Yu et al., "Hybrid Parity-Check and CRC Aided SCL Decoding for Polar Codes," 2016 IEEE International Conference on Internet of Things (iThings) and IEEE Green Computing and Communications (GreenCom) and IEEE Cyber, Physical and Social Computing (CPSCom) and IEEE Smart Data (SmartData), XP033093024, pp. 711-716, Institute of Electrical and Electronics Engineers, New York, New York (2016).

Wang et al., "Parity-Check-Concatenated Polar Codes," IEEE Communications Letters, vol. 20, No. 12 XP055607890, pp. 2342-2345, Institute of Electrical and Electronics Engineers, New York, New York (Dec. 2016).

\* cited by examiner

DATA TRANSMISSION METHOD AND APPARATUS

CROSS-REFERENCE TO RELATED APPLICATIONS

This application is a continuation of International Patent Application No. PCT/CN2018/072903, filed on Jan. 16, 2018, which claims priority to Chinese Patent Application No. 201710061380.3, filed on Jan. 25, 2017. The disclosures of the aforementioned applications are hereby incorporated by reference in their entireties.

TECHNICAL FIELD

Embodiments of this application relate to communications technologies, and in particular, to a polar code encoding method and apparatus.

BACKGROUND

Rapid evolution of wireless communications indicates that a future fifth generation (5G) communications system presents some new features. Three most typical communication scenarios include enhanced mobile broadband (eMBB), massive machine-type communications (mMTC), and ultra-reliable and low-latency communications (URLLC). Requirements of these communication scenarios present a new challenge to an existing long term evolution (LTE) technology. A communications system usually uses channel encoding to improve data transmission reliability and ensure communication quality. As a most basic radio access technology, channel encoding is one of important research objects to meet a 5G communication requirement.

Recently, Arikan proposes an encoding mode based on channel polarization, which is referred to as a polar code. The polar code is a first and uniquely known channel encoding method that can be strictly proved to "achieve" a channel capacity. In a case of different code lengths, particularly for a limited code length, performance of the polar code is far better than performance of a turbo code and performance of an LDPC code. In addition, the polar code has relatively low computational complexity in encoding and decoding. The polar code has a great development and application prospect in 5G because of these advantages, and is accepted for control channel encoding in an eMBB service in the 3GPP ($3^{rd}$ Generation Partner Project) RAN1 (Radio Access Network) meeting #87.

The polar code is an encoding mode that can achieve a Shannon capacity and that has low encoding and decoding complexity. The polar code is a linear block code. A generation matrix of the polar code is $G_N$, and an encoding process of the polar code is $x_1^N = u_1^N G_N$, where $u_1^N = (u_0, u_1, u_2, \ldots, u_N)$ is a binary row vector, $G_N = B_N F_2^{\otimes(log_2(N))}$, a code length is $N=2^n$, and n is a positive integer.

$$F_2 = \begin{bmatrix} 1 & 0 \\ 1 & 1 \end{bmatrix},$$

and $B_N$ is an N×N transposed matrix, such as a bit reversal matrix. It should be noted that $B_N$ is not a mandatory operation (in other words, $B_N$ is a unit matrix). $F_2^{\otimes(log_2(N))}$ is $F_2$ raised to the Kronecker power, and is defined as follows: $F^{\otimes(log_2(N))} = F \otimes F^{\otimes(log_2(N))-1}$.

Specifically, the polar code is a channel-dependent code. The polar code is used to perform polar code polarization processing on N identical channels W, to obtain N polarized channels. Certainly, Bhattacharyya parameters of the N polarized channels either approach 0 or approach 1. In actual application of the polar code, an important operation is to calculate reliability of all the ($N=2^n$) polarized channels for different channels W, and then select K polarized channels with relatively high reliability from the N polarized channels. A set of location index numbers corresponding to these polarized channels is referred to as an information set $\mathcal{A}$. Other bits are set as fixed values pre-agreed on by a transmit end and a receive end, and are referred to as frozen bits. A set of sequence numbers of the frozen bits is denoted as a complementary set $\mathcal{A}^c$ of $\mathcal{A}$. During polar code encoding, K information symbols are placed at corresponding locations in the information set, and fixed known symbols are placed at remaining (N−K) locations (referred to as a frozen set). Generally, the (N−K) fixed known symbols may be all 0 symbols, where K≤N. Actually, a value of the frozen bit may be randomly set, provided that the transmit end and the receive end pre-agree on the value. Because there is a one-to-one correspondence between polarized channels and bits, the polarized channels are usually described by using bit locations.

With development of a polar code technology, an original encoding mode needs to be improved to adapt to various scenarios.

SUMMARY

This application provides a polar code encoding method and apparatus.

A first aspect of this application provides a polar code encoding method, including:

performing, by a sending device, polar code encoding on a to-be-encoded sequence, where a mother code length of a polar code is N, the to-be-encoded sequence includes frozen bits, parity check frozen bits, and information bits, the to-be-encoded sequence includes q segments, $N=2^n$, n and q are positive integers, and q=n or q<n; and a value of at least one of the parity check frozen bits is determined based on at least one of the frozen bit and the information bit; or a value of at least one of the parity check frozen bits is a preset value; and sending, by the sending device, an encoded sequence.

By using the method, the sending device segments the to-be-encoded sequence according to a preset rule; determines a quantity of parity check frozen bits, locations of the parity check frozen bits, a quantity of information bits, locations of the information bits, a quantity of frozen bits, and locations of the frozen bits in each segment; then places the information bits and the frozen bits at the corresponding locations; determines values of the parity check frozen bits; then performs polar code encoding on the to-be-encoded sequence; and sends the encoded sequence. According to this method, a process of determining the quantity of parity check frozen bits and the locations of the parity check frozen bits is simplified, thereby effectively improving processing efficiency. Therefore, parity check frozen bit location selection is decoupled from reliability calculation, so that a process of determining the locations and the values of the parity check frozen bits is simplified, thereby effectively improving processing efficiency.

In a possible implementation, the to-be-encoded sequence includes the q segments; a sequence number of a bit location of $a^{tth}$ segment point is Bt; when Bt is represented by using an n-bit binary number, $a^{tth}$ bit in the n-bit binary number is 0, and remaining (n−1) bits are all 1; and 0<t<q.

In a possible implementation, a value range of a sequence number of a bit location in the to-be-encoded sequence is any integer greater than or equal to 0 and less than N; and when N=16, a set of sequence numbers of bit locations corresponding to segment points is [7, 11]; or when N=32, a set of sequence numbers of bit locations corresponding to segment points is [15, 23, 27]; or when N=64, a set of sequence numbers of bit locations corresponding to segment points is [31, 47, 55, 59]; or when N=128, a set of sequence numbers of bit locations corresponding to segment points is [63, 95, 111, 119, 123]; or when N=256, a set of sequence numbers of bit locations corresponding to segment points is [127, 191, 223, 239, 247, 251]; or when N=512, a set of sequence numbers of bit locations corresponding to segment points is [255, 383, 447, 479, 495, 503, 507]; or when N=1024, a set of sequence numbers of bit locations corresponding to segment points is [511, 767, 895, 959, 991, 1007, 1015, 1019]; or when N=2048, a set of sequence numbers of bit locations corresponding to segment points is [1023, 1535, 1791, 1919, 1983, 2015, 2031, 2039, 2043]; or when N=4096, a set of sequence numbers of bit locations corresponding to segment points is [2047, 3071, 3583, 3839, 3967, 4031, 4065, 4079, 4087, 4091].

In a possible implementation, the segment point is determined by using an n ($n=\log_2 N$)-bit shift register.

In a possible implementation, a quantity $P_{fg}$ of parity check frozen bits in a $g_t h$ segment in the q segments is $P_{fg}=\text{round}(P_f * G_g/(K+P_f))$, where round is a rounding operation, $P_f$ is a quantity of parity check frozen bits, $G_g$ is a sum of a quantity of information bits and a quantity of parity check frozen bits in a $g^{th}$ segment, K is a quantity of information bits, $P_f$, g, and K are all positive integers, $G_g$ and $P_{fg}$ are nonnegative integers, and 0<g≤q.

In a possible implementation, the quantity of parity check frozen bits in the $g^{th}$ segment may alternatively be determined by using another function, for example, in a rounding manner; or in a manner of allocating the parity check frozen bits as averagely as possible, where the manner is similar to equal-length segmentation; or in any allocation manner agreed on by the sending device and a receiving device.

In a possible implementation, parity check frozen bit locations in the $g^{th}$ segment are $P_{fg}$ bit locations with smallest bit location sequence numbers other than frozen bit locations in the $g^{th}$ segment; or parity check frozen bit locations in the $g^{th}$ segment are $P_{fg}$ bit locations with largest bit location sequence numbers other than frozen bit locations in the $g^{th}$ segment; or parity check frozen bit locations in the $g^{th}$ segment are $P_{fg}$ bit locations that are agreed on by the sending device and a receiving device and that are other than frozen bit locations in the $g^{th}$ segment.

In a possible implementation, the to-be-encoded sequence is $[u_0, u_1, u_2, \ldots, \text{and } u_{N-1}]$; the value of the at least one of the parity check frozen bits is determined based on at least one of the frozen bit and the information bit, or the value of the at least one of the parity check frozen bits is the preset value; and the value of the parity check frozen bit is obtained by performing the following step:

successively performing, by the sending device, interaction operations with a cyclic shift register in order based on elements in the to-be-encoded sequence $[u_0, u_1, u_2, \ldots, \text{and } u_{N-1}]$, where the cyclic shift register rotates by one bit in a fixed direction after each operation, a length of the cyclic shift register is p, initial states $y[0], y[1], \ldots,$ and $y[p-1]$ of the cyclic shift register are a known binary sequence with a length of p, and p is a positive integer and a prime number; and if a location of $u_i$ is not the parity check frozen bit location, $y[x]=(u_i \text{ XOR } y[x])$; or if a location of $u_i$ is the parity check frozen bit location, the parity check frozen bit is $u_i=y[x]$, where $i=0, 1, \ldots,$ or $N-1$, $y[x]$ is a state of an $x^{th}$ register unit in the cyclic shift register, 0≤x≤p−1, and i and x are integers.

In a possible implementation, the sequence is a sequence from left to right or from right to left, or is any sequence agreed on by the sending device and the receiving device.

In a possible implementation, the fixed direction is clockwise or counterclockwise.

In a possible implementation, the to-be-encoded sequence includes the q segments, and the segments include a same quantity of bit locations, where $q=2^v$, v is a positive integer, and 0<v<n.

In a possible implementation, one bit location is selected from each of the q segments in descending order of average reliability in each segment as the parity check frozen bit location. A bit location with lowest reliability other than the frozen bit location in each segment is selected, or a bit location with highest reliability other than the frozen bit location in each segment is selected, or any bit location agreed on by the sending device and the receiving device is selected.

A second aspect of this application provides a polar code decoding method, including:

performing, by a receiving device, polar code decoding on a received to-be-decoded sequence to obtain a decoded sequence, where a mother code length of a polar code is N, a length of the to-be-decoded sequence is N, the to-be-decoded sequence includes frozen bits, parity check frozen bits, and information bits, the to-be-decoded sequence includes q segments, $N=2^n$, n and q are positive integers, and q=n or q<n.

In a possible implementation, the to-be-decoded sequence includes the q segments; a sequence number of a bit location of a $t^{th}$ segment point is Bt; when Bt is represented by using an n-bit binary number, a $t^{th}$ bit in the n-bit binary number is 0, and remaining (n−1) bits are all 1; and 0<t<q.

In a possible implementation, a value range of a sequence number of a bit location in the to-be-decoded sequence is any integer greater than or equal to 0 and less than N; and when N=16, a set of sequence numbers of bit locations corresponding to segment points is [7, 11]; or when N=32, a set of sequence numbers of bit locations corresponding to segment points is [15, 23, 27]; or when N=64, a set of sequence numbers of bit locations corresponding to segment points is [31, 47, 55, 59]; or when N=128, a set of sequence numbers of bit locations corresponding to segment points is [63, 95, 111, 119, 123]; or when N=256, a set of sequence numbers of bit locations corresponding to segment points is [127, 191, 223, 239, 247, 251]; or when N=512, a set of sequence numbers of bit locations corresponding to segment points is [255, 383, 447, 479, 495, 503, 507]; or when N=1024, a set of sequence numbers of bit locations corresponding to segment points is [511, 767, 895, 959, 991, 1007, 1015, 1019]; or when N=2048, a set of sequence numbers of bit locations corresponding to segment points is [1023, 1535, 1791, 1919, 1983, 2015, 2031, 2039, 2043]; or when N=4096, a set of sequence numbers of bit locations corresponding to segment points is [2047, 3071, 3583, 3839, 3967, 4031, 4065, 4079, 4087, 4091].

In a possible implementation, the segment point is determined by using an n (n=log$_2$N)-bit shift register.

In a possible implementation, a quantity $P_{fg}$ of parity check frozen bits in a $g_{th}$ segment in the q segments is $P_{fg}$=round($P_f*G_g/(K+P_f)$), where round is a rounding operation, $P_f$ is a quantity of parity check frozen bits, $G_g$ is a sum of a quantity of information bits and a quantity of parity check frozen bits in a $g^{th}$ segment, K is a quantity of information bits, $P_f$, g, and K are all positive integers, $G_g$ and $P_{fg}$ are nonnegative integers, and 0<g≤q.

In a possible implementation, the quantity of parity check frozen bits in the $g^{th}$ segment may alternatively be determined by using another function, for example, in a rounding manner; or in a manner of allocating the parity check frozen bits as averagely as possible, where the manner is similar to equal-length segmentation; or in any allocation manner agreed on by a sending device and the receiving device.

In a possible implementation, parity check frozen bit locations in the $g^{th}$ segment are $P_{fg}$ bit locations with smallest bit location sequence numbers other than frozen bit locations in the $g^{th}$ segment; or parity check frozen bit locations in the $g^{th}$ segment are $P_{fg}$ bit locations with largest bit location sequence numbers other than frozen bit locations in the $g^{th}$ segment; or parity check frozen bit locations in the $g^{th}$ segment are $P_{fg}$ bit locations that are agreed on by the receiving device and a sending device and that are other than frozen bit locations in the $g^{th}$ segment.

In a possible implementation, the to-be-encoded sequence includes the q segments, and the segments include a same quantity of bit locations, where q=2$^v$, v is a positive integer, and 0<v<n.

In a possible implementation, one bit location is selected from each of the q segments in descending order of average reliability in each segment as the parity check frozen bit location. A bit location with lowest reliability other than the frozen bit location in each segment is selected, or a bit location with highest reliability other than the frozen bit location in each segment is selected, or any bit location agreed on by the sending device and the receiving device is selected.

A third aspect of this application provides a polar code encoding apparatus, including:

an encoding module, configured to perform polar code encoding on a to-be-encoded sequence, where a mother code length of a polar code is N, the to-be-encoded sequence includes frozen bits, parity check frozen bits, and information bits, the to-be-encoded sequence includes q segments, N=2$^n$, n and q are positive integers, and q=n or q<n;

a processing module, configured to determine a value of at least one of the parity check frozen bits based on at least one of the frozen bit and the information bit; or configured to determine that a value of at least one of the parity check frozen bits is a preset value; and a sending module, configured to send an encoded sequence.

In a possible implementation, the to-be-encoded sequence includes the q segments; a sequence number of a bit location of a $t^{th}$ segment point is Bt; when Bt is represented by using an n-bit binary number, a $t^{th}$ bit in the n-bit binary number is 0, and remaining (n−1) bits are all 1; and 0<t<q.

In a possible implementation, a value range of a sequence number of a bit location in the to-be-encoded sequence is any integer greater than or equal to 0 and less than N; and when N=16, a set of sequence numbers of bit locations corresponding to segment points is [7, 11]; or when N=32, a set of sequence numbers of bit locations corresponding to segment points is [15, 23, 27]; or when N=64, a set of sequence numbers of bit locations corresponding to segment points is [31, 47, 55, 59]; or when N=128, a set of sequence numbers of bit locations corresponding to segment points is [63, 95, 111, 119, 123]; or when N=256, a set of sequence numbers of bit locations corresponding to segment points is [127, 191, 223, 239, 247, 251]; or when N=512, a set of sequence numbers of bit locations corresponding to segment points is [255, 383, 447, 479, 495, 503, 507]; or when N=1024, a set of sequence numbers of bit locations corresponding to segment points is [511, 767, 895, 959, 991, 1007, 1015, 1019]; or when N=2048, a set of sequence numbers of bit locations corresponding to segment points is [1023, 1535, 1791, 1919, 1983, 2015, 2031, 2039, 2043]; or when N=4096, a set of sequence numbers of bit locations corresponding to segment points is [2047, 3071, 3583, 3839, 3967, 4031, 4065, 4079, 4087, 4091].

In a possible implementation, the segment point is determined by using an n (n=log$_2$N)-bit shift register.

In a possible implementation, a quantity $P_{fg}$ of parity check frozen bits in a $g_{th}$ segment in the q segments is $P_{fg}$=round($P_f*G_g/(K+P_f)$), where round is a rounding operation, $P_f$ is a quantity of parity check frozen bits, $G_g$ is a sum of a quantity of information bits and a quantity of parity check frozen bits in a $g^{th}$ segment, K is a quantity of information bits, $P_f$, g, and K are all positive integers, $G_g$ and $P_{fg}$ are nonnegative integers, and 0<g≤q.

In a possible implementation, the quantity of parity check frozen bits in the $g^{th}$ segment may alternatively be determined by using another function, for example, in a rounding manner; or in a manner of allocating the parity check frozen bits as averagely as possible, where the manner is similar to equal-length segmentation; or in any allocation manner agreed on by the apparatus and a receiving device.

In a possible implementation, parity check frozen bit locations in the $g^{th}$ segment are $P_{fg}$ bit locations with smallest bit location sequence numbers other than frozen bit locations in the $g^{th}$ segment; or parity check frozen bit locations in the $g^{th}$ segment are $P_{fg}$ bit locations with largest bit location sequence numbers other than frozen bit locations in the $g^{th}$ segment; or parity check frozen bit locations in the $g^{th}$ segment are $P_{fg}$ bit locations that are agreed on by the apparatus and a receiving device and that are other than frozen bit locations in the $g^{th}$ segment.

In a possible implementation, the to-be-encoded sequence is [$u_0, u_1, u_2, \ldots,$ and $u_{N-1}$]; the value of the at least one of the parity check frozen bits is determined based on at least one of the frozen bit and the information bit, or the value of the at least one of the parity check frozen bits is the preset value; and the value of the parity check frozen bit is obtained by performing the following step:

successively performing, by the apparatus, interaction operations with a cyclic shift register in order based on elements in the to-be-encoded sequence [$u_0, u_1, u_2, \ldots,$ and $u_{N-1}$], where the cyclic shift register rotates by one bit in a fixed direction after each operation, a length of the cyclic shift register is p, initial states y[0], y[1], . . . , and y[p−1]

of the cyclic shift register are a known binary sequence with a length of p, and p is a positive integer and a prime number; and if a location of $u_i$ is not the parity check frozen bit location, $y[x]=(u_i$ XOR $y[x])$; or if a location of $u_i$ is the parity check frozen bit location, the parity check frozen bit is $u_i=y[x]$, where $i=0, 1, \ldots$, or N−1, $y[x]$ is a state of an $x^{th}$ register unit in the cyclic shift register, $0 \le x \le p-1$, and i and x are integers.

In a possible implementation, the sequence is a sequence from left to right or from right to left, or is any sequence agreed on by the apparatus and the receiving device.

In a possible implementation, the fixed direction is clockwise or counterclockwise.

In a possible implementation, the to-be-encoded sequence includes the q segments, and the segments include a same quantity of bit locations, where $q=2^v$, v is a positive integer, and $0<v<n$.

In a possible implementation, one bit location is selected from each of the q segments in descending order of average reliability in each segment as the parity check frozen bit location. A bit location with lowest reliability other than the frozen bit location in each segment is selected, or a bit location with highest reliability other than the frozen bit location in each segment is selected, or any bit location agreed on by the apparatus and the receiving device is selected.

A fourth aspect of this application provides a polar code decoding apparatus, including:

an obtaining module, configured to obtain a to-be-decoded sequence; and a decoding module, configured to perform polar code decoding on the received to-be-decoded sequence to obtain a decoded sequence, where a mother code length of a polar code is N, a length of the to-be-decoded sequence is N, the to-be-decoded sequence includes frozen bits, parity check frozen bits, and information bits, the to-be-decoded sequence includes q segments, $N=2^n$, n and q are positive integers, and $q=n$ or $q<n$.

In a possible implementation, the apparatus further includes:

a processing module, configured to divide the to-be-decoded sequence into the q segments, where a sequence number of a bit location of a $t^{th}$ segment point is Bt; when Bt is represented by using an n-bit binary number, a $t^{th}$ bit in the n-bit binary number is 0, and remaining (n−1) bits are all 1; and $0<t<q$.

In a possible implementation, a value range of a sequence number of a bit location in the to-be-decoded sequence is any integer greater than or equal to 0 and less than N; and when N=16, a set of sequence numbers of bit locations corresponding to segment points is [7, 11]; or when N=32, a set of sequence numbers of bit locations corresponding to segment points is [15, 23, 27]; or when N=64, a set of sequence numbers of bit locations corresponding to segment points is [31, 47, 55, 59]; or when N=128, a set of sequence numbers of bit locations corresponding to segment points is [63, 95, 111, 119, 123]; or when N=256, a set of sequence numbers of bit locations corresponding to segment points is [127, 191, 223, 239, 247, 251]; or when N=512, a set of sequence numbers of bit locations corresponding to segment points is [255, 383, 447, 479, 495, 503, 507]; or when N=1024, a set of sequence numbers of bit locations corresponding to segment points is [511, 767, 895, 959, 991, 1007, 1015, 1019]; or when N=2048, a set of sequence numbers of bit locations corresponding to segment points is [1023, 1535, 1791, 1919, 1983, 2015, 2031, 2039, 2043]; or when N=4096, a set of sequence numbers of bit locations corresponding to segment points is [2047, 3071, 3583, 3839, 3967, 4031, 4065, 4079, 4087, 4091].

In a possible implementation, the segment point is determined by using an n ($n=\log_2 N$)-bit shift register.

In a possible implementation, a quantity $P_{fg}$ of parity check frozen bits in a $g_{th}$ segment in the q segments is $P_{fg}=\text{round}(P_f*G_g/(K+P_f))$, where round is a rounding operation, $P_f$ is a quantity of parity check frozen bits, $G_g$ is a sum of a quantity of information bits and a quantity of parity check frozen bits in a $g^{th}$ segment, K is a quantity of information bits, $P_f$, g, and K are all positive integers, $G_g$ and $P_{fg}$ are nonnegative integers, and $0<g \le q$.

In a possible implementation, the quantity of parity check frozen bits in the $g^{th}$ segment may alternatively be determined by using another function, for example, in a rounding manner; or in a manner of allocating the parity check frozen bits as averagely as possible, where the manner is similar to equal-length segmentation; or in any allocation manner agreed on by a sending device and the apparatus.

In a possible implementation, parity check frozen bit locations in the $g^{th}$ segment are $P_{fg}$ bit locations with smallest bit location sequence numbers other than frozen bit locations in the $g^{th}$ segment; or parity check frozen bit locations in the $g^{th}$ segment are $P_{fg}$ bit locations with largest bit location sequence numbers other than frozen bit locations in the $g^{th}$ segment; or parity check frozen bit locations in the $g^{th}$ segment are $P_{fg}$ bit locations that are agreed on by the apparatus and a sending device and that are other than frozen bit locations in the $g^{th}$ segment.

In a possible implementation, the to-be-encoded sequence includes the q segments, and the segments include a same quantity of bit locations, where $q=2^v$, v is a positive integer, and $0<v<n$.

In a possible implementation, one bit location is selected from each of the q segments in descending order of average reliability in each segment as the parity check frozen bit location. A bit location with lowest reliability other than the frozen bit location in each segment is selected, or a bit location with highest reliability other than the frozen bit location in each segment is selected, or any bit location agreed on by the sending device and the apparatus is selected.

A fifth aspect of this application provides a polar code encoding entity apparatus, including:

a memory, configured to store an executable instruction; and a processor, configured to: read the instruction stored in the memory; and perform polar code encoding on a to-be-encoded sequence, where a mother code length of a polar code is N, the to-be-encoded sequence includes frozen bits, parity check frozen bits, and information bits, the to-be-encoded sequence includes q segments, $N=2^n$, n and q are positive integers, and $q=n$ or $q<n$.

The processor is further configured to determine a value of at least one of the parity check frozen bits based on at least one of the frozen bit and the information bit; or configured to determine that a value of at least one of the parity check frozen bits is a preset value.

In a possible implementation, the apparatus further includes a transmitter, configured to send an encoded sequence.

In a possible implementation, the memory may be independent, or may be integrated with the processor.

When the memory is a component independent of the processor, the apparatus may further include:

a bus, configured to connect the memory and the processor.

In a possible implementation, the to-be-encoded sequence includes the q segments;

a sequence number of a bit location of a $t^{th}$ segment point is Bt; when Bt is represented by using an n-bit binary number, a $t^{th}$ bit in the n-bit binary number is 0, and remaining (n−1) bits are all 1; and 0<t<q.

In a possible implementation, a value range of a sequence number of a bit location in the to-be-encoded sequence is any integer greater than or equal to 0 and less than N; and when N=16, a set of sequence numbers of bit locations corresponding to segment points is [7, 11]; or when N=32, a set of sequence numbers of bit locations corresponding to segment points is [15, 23, 27]; or when N=64, a set of sequence numbers of bit locations corresponding to segment points is [31, 47, 55, 59]; or when N=128, a set of sequence numbers of bit locations corresponding to segment points is [63, 95, 111, 119, 123]; or when N=256, a set of sequence numbers of bit locations corresponding to segment points is [127, 191, 223, 239, 247, 251]; or when N=512, a set of sequence numbers of bit locations corresponding to segment points is [255, 383, 447, 479, 495, 503, 507]; or when N=1024, a set of sequence numbers of bit locations corresponding to segment points is [511, 767, 895, 959, 991, 1007, 1015, 1019]; or when N=2048, a set of sequence numbers of bit locations corresponding to segment points is [1023, 1535, 1791, 1919, 1983, 2015, 2031, 2039, 2043]; or when N=4096, a set of sequence numbers of bit locations corresponding to segment points is [2047, 3071, 3583, 3839, 3967, 4031, 4065, 4079, 4087, 4091].

In a possible implementation, the segment point is determined by using an n (n=log$_2$N)-bit shift register.

In a possible implementation, a quantity $P_{fg}$ of parity check frozen bits in a $g_t$h segment in the q segments is $P_{fg}$ round($P_f$*$G_g$/(K+$P_f$)), where round is a rounding operation, $P_f$ is a quantity of parity check frozen bits, $G_g$ is a sum of a quantity of information bits and a quantity of parity check frozen bits in a $g^{th}$ segment, K is a quantity of information bits, $P_f$, g, and K are all positive integers, $G_g$ and $P_{fg}$ are nonnegative integers, and 0<g≤q.

In a possible implementation, the quantity of parity check frozen bits in the $g^{th}$ segment may alternatively be determined by using another function, for example, in a rounding manner; or in a manner of allocating the parity check frozen bits as averagely as possible, where the manner is similar to equal-length segmentation; or in any allocation manner agreed on by the apparatus and a receiving device.

In a possible implementation, parity check frozen bit locations in the $g^{th}$ segment are $P_{fg}$ bit locations with smallest bit location sequence numbers other than frozen bit locations in the $g^{th}$ segment; or parity check frozen bit locations in the $g^{th}$ segment are $P_{fg}$ bit locations with largest bit location sequence numbers other than frozen bit locations in the $g^{th}$ segment; or parity check frozen bit locations in the $g^{th}$ segment are $P_{fg}$ bit locations that are agreed on by the apparatus and a receiving device and that are other than frozen bit locations in the $g^{th}$ segment.

In a possible implementation, the to-be-encoded sequence is [$u_0$, $u_1$, $u_2$, . . . , and $u_{N-1}$]; the value of the at least one of the parity check frozen bits is determined based on at least one of the frozen bit and the information bit, or the value of the at least one of the parity check frozen bits is the preset value; and the value of the parity check frozen bit is obtained by performing the following step:

successively performing, by the apparatus, interaction operations with a cyclic shift register in order based on elements in the to-be-encoded sequence [$u_0$, $u_1$, $u_2$, . . . , and $u_{N-1}$], where the cyclic shift register rotates by one bit in a fixed direction after each operation, a length of the cyclic shift register is p, initial states y[0], y[1], . . . , and y[p−1] of the cyclic shift register are a known binary sequence with a length of p, and p is a positive integer and a prime number; and if a location of $u_i$ is not the parity check frozen bit location, y[x]=($u_i$ XOR y [x]); or if a location of $u_i$ is the parity check frozen bit location, the parity check frozen bit is $u_i$=y[x], where i=0, 1, . . . , or N−1, y[x] is a state of an $x^{th}$ register unit in the cyclic shift register, 0≤x≤p−1, and i and x are integers.

In a possible implementation, the sequence is a sequence from left to right or from right to left, or is any sequence agreed on by the apparatus and the receiving device.

In a possible implementation, the fixed direction is clockwise or counterclockwise.

In a possible implementation, the to-be-encoded sequence includes the q segments, and the segments include a same quantity of bit locations, where q=2$^v$, v is a positive integer, and 0<v<n.

In a possible implementation, one bit location is selected from each of the q segments in descending order of average reliability in each segment as the parity check frozen bit location. A bit location with lowest reliability other than the frozen bit location in each segment is selected, or a bit location with highest reliability other than the frozen bit location in each segment is selected, or any bit location agreed on by the apparatus and the receiving device is selected.

A sixth aspect of this application provides a polar code decoding apparatus, including:

a memory, configured to store an executable instruction; and a processor, configured to: read the instruction stored in the memory; and perform polar code decoding on a received to-be-decoded sequence to obtain a decoded sequence, where a mother code length of a polar code is N, a length of the to-be-decoded sequence is N, the to-be-decoded sequence includes frozen bits, parity check frozen bits, and information bits, the to-be-decoded sequence includes q segments, N=2$^n$, n and q are positive integers, and q=n or q<n.

In a possible implementation, the apparatus further includes:

a receiver, configured to: receive a to-be-decoded signal, and send the to-be-decoded signal to the processor.

In a possible implementation, the processor is configured to divide the to-be-decoded sequence into the q segments, where a sequence number of a bit location of a $t^{th}$ segment point is Bt; when Bt is represented by using an n-bit binary number, a $t^{th}$ bit in the n-bit binary number is 0, and remaining (n−1) bits are all 1; and 0<t<q.

In a possible implementation, the memory may be independent, or may be integrated with the processor.

When the memory is a component independent of the processor, the apparatus may further include:

a bus, configured to connect the memory and the processor.

In a possible implementation, a value range of a sequence number of a bit location in the to-be-decoded sequence is any integer greater than or equal to 0 and less than N; and when N=16, a set of sequence numbers of bit locations corresponding to segment points is [7, 11]; or when N=32, a set of sequence numbers of bit locations corresponding to segment points is [15, 23, 27]; or when N=64, a set of sequence numbers of bit locations corresponding to segment points is [31, 47, 55, 59]; or when N=128, a set of sequence numbers of bit locations corresponding to segment points is [63, 95, 111, 119, 123]; or when N=256, a set of sequence numbers of bit locations corresponding to segment points is [127, 191, 223, 239, 247, 251]; or when N=512, a set of sequence numbers of bit locations corresponding to segment points is [255, 383, 447, 479, 495, 503, 507]; or when N=1024, a set of sequence numbers of bit locations corresponding to segment points is [511, 767, 895, 959, 991, 1007, 1015, 1019]; or when N=2048, a set of sequence numbers of bit locations corresponding to segment points is [1023, 1535, 1791, 1919, 1983, 2015, 2031, 2039, 2043]; or when N=4096, a set of sequence numbers of bit locations corresponding to segment points is [2047, 3071, 3583, 3839, 3967, 4031, 4065, 4079, 4087, 4091].

In a possible implementation, the segment point is determined by using an n (n=log$_2$N)-bit shift register.

In a possible implementation, a quantity $P_{fg}$ of parity check frozen bits in a $g_{th}$ segment in the q segments is $P_{fg}$=round($P_f*G_g/(K+P_f)$), where round is a rounding operation, $P_f$ is a quantity of parity check frozen bits, $G_g$ is a sum of a quantity of information bits and a quantity of parity check frozen bits in a $g^{th}$ segment, K is a quantity of information bits, $P_f$, g, and K are all positive integers, $G_g$ and $P_{fg}$ are nonnegative integers, and 0<g≤q.

In a possible implementation, the quantity of parity check frozen bits in the $g^{th}$ segment may alternatively be determined by using another function, for example, in a rounding manner; or in a manner of allocating the parity check frozen bits as averagely as possible, where the manner is similar to equal-length segmentation; or in any allocation manner agreed on by a sending device and the apparatus.

In a possible implementation, parity check frozen bit locations in the $g^{th}$ segment are $P_{fg}$ bit locations with smallest bit location sequence numbers other than frozen bit locations in the $g^{th}$ segment; or parity check frozen bit locations in the $g^{th}$ segment are $P_{fg}$ bit locations with largest bit location sequence numbers other than frozen bit locations in the $g^{th}$ segment; or parity check frozen bit locations in the $g^{th}$ segment are $P_{fg}$ bit locations that are agreed on by the apparatus and a sending device and that are other than frozen bit locations in the $g^{th}$ segment.

In a possible implementation, the to-be-encoded sequence includes the q segments, and the segments include a same quantity of bit locations, where q=2$^v$, v is a positive integer, and 0<v<n.

In a possible implementation, one bit location is selected from each of the q segments in descending order of average reliability in each segment as the parity check frozen bit location. A bit location with lowest reliability other than the frozen bit location in each segment is selected, or a bit location with highest reliability other than the frozen bit location in each segment is selected, or any bit location agreed on by the sending device and the apparatus is selected.

A seventh aspect of this application provides a readable storage medium. The readable storage medium stores an executable instruction. When at least one processor of a sending device executes the executable instruction, the sending device performs the polar code encoding method provided in the first aspect or various implementations of the first aspect.

An eighth aspect of this application provides a readable storage medium. The readable storage medium stores an executable instruction. When at least one processor of a receiving device executes the executable instruction, the receiving device performs the polar code decoding method provided in the second aspect or various implementations of the second aspect.

A ninth aspect of this application provides a program product. The program product includes an executable instruction, and the executable instruction is stored in a readable storage medium. At least one processor of a sending device can read the executable instruction from the readable storage medium, and the at least one processor executes the executable instruction, so that the sending device implements the polar code encoding method provided in the first aspect or various implementations of the first aspect.

A tenth aspect of this application provides a program product. The program product includes an executable instruction, and the executable instruction is stored in a readable storage medium. At least one processor of a receiving device can read the executable instruction from the readable storage medium, and the at least one processor executes the executable instruction, so that the receiving device implements the polar code decoding method provided in the second aspect or various implementations of the second aspect.

According to the polar code encoding method, the polar code decoding method, and the apparatus provided in this application, the sending device divides a to-be-sent transport block into a plurality of code blocks, adds a one-bit parity check bit to at least one of the code blocks, performs LDPC encoding on each code block to obtain a plurality of data bit sequences, and sends the data bit sequences to the receiving device. After receiving the data bit sequences, the receiving device decodes the data bit sequences, extracts a parity check bit from a code block to which the parity check bit is added, and checks the corresponding code block to determine whether the code block needs to be retransmitted. In this solution, only one-bit parity check bits are added to some code blocks, so that transmission resources are saved, and decoding overheads of the receiving device are effectively reduced.

DESCRIPTION OF EMBODIMENTS

Figure 1:
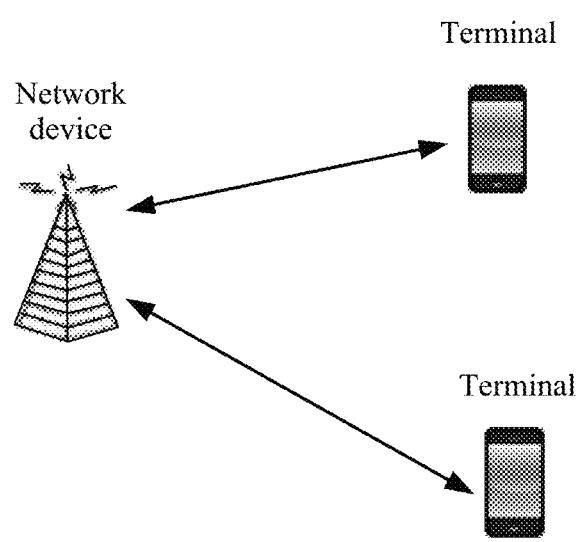
FIG. 1 is a schematic diagram of a system architecture according to this application.

Technical solutions of this application may be applied to Wi-Fi, 4G, 5G, and future communications systems. FIG. 1 is a schematic diagram of a system architecture of a data sending or receiving method according to this application. As shown in FIG. 1, the system architecture includes a network device (such as a base station) and a terminal; or may include a Wi-Fi access point, a Wi-Fi terminal, or the like. A quantity of network devices and a quantity of terminals are not limited in the solutions. The network device transmits downlink data to the terminal, and the terminal transmits uplink data to the network device. In a process of transmitting the uplink data or the downlink data, a subsequently provided method may be used.

In the foregoing architecture, the network device may be a base station or another device that can provide a function similar to that of the base station, and the network device provides the terminal device with a communications service. The terminal may be a mobile station (MS), a subscriber unit, a cellular phone, a smartphone, a wireless data card, a personal digital assistant (PDA) computer, a tablet computer, a wireless modem, a handheld device, a laptop computer, a cordless phone, a wireless local loop (WLL) station, a machine type communication (MTC) terminal, or the like. For ease of description, in all the embodiments of this application, the devices mentioned above are collectively referred to as the terminal.

In D2D (device-to-device) communication, the network device may alternatively be a terminal that functions as a base station. In addition, the base station is also referred to as a radio access network (RAN) device, and is a device that connects the terminal and a wireless network. The base station in the foregoing architecture may alternatively be a base transceiver station (BTS) in global system for mobile communications (GSM) or code division multiple access (CDMA); or may be a NodeB (NB) in wideband code division multiple access (WCDMA); or may be an evolved NodeB (eNB or eNodeB) in long term evolution (LTE), a relay station or an access point, a base station in a 5G network and a future communications network, or the like. This is not limited herein.

A Parity-Check Polar (PC-Polar,) code is an improved polar code, and is used to select some channels from frozen bits as PC channels. In these channels, a PC function (parity check function) is used for error correction. At each PC channel location, all decoded bits related to the PC function are used to assist list decoding pruning: Only a path that meets the PC function or PC-frozen can exist, and remaining paths are deleted as decoding proceeds. In this manner, decoding performance is further improved effectively. However, a search process is relatively complex when a PC channel is determined, to be specific, when a parity check frozen bit location is determined in a to-be-encoded sequence. This PC-polar is closely related to a reliability calculation method, and reliability and a quantity of parity check frozen bits can be determined based on only a parameter in a polarization weight calculation method. As a result, a transmit end and a receive end need to obtain the quantity of parity check frozen bits and locations of the parity check frozen bits through a complex calculation process each time, and consequently an unnecessary delay is caused; or a transmit end and a receive end need to store a large table to store a quantity of parity check bits and locations of the parity check bits having various code lengths and code rates, and consequently relatively large storage space is occupied.

Figure 2:
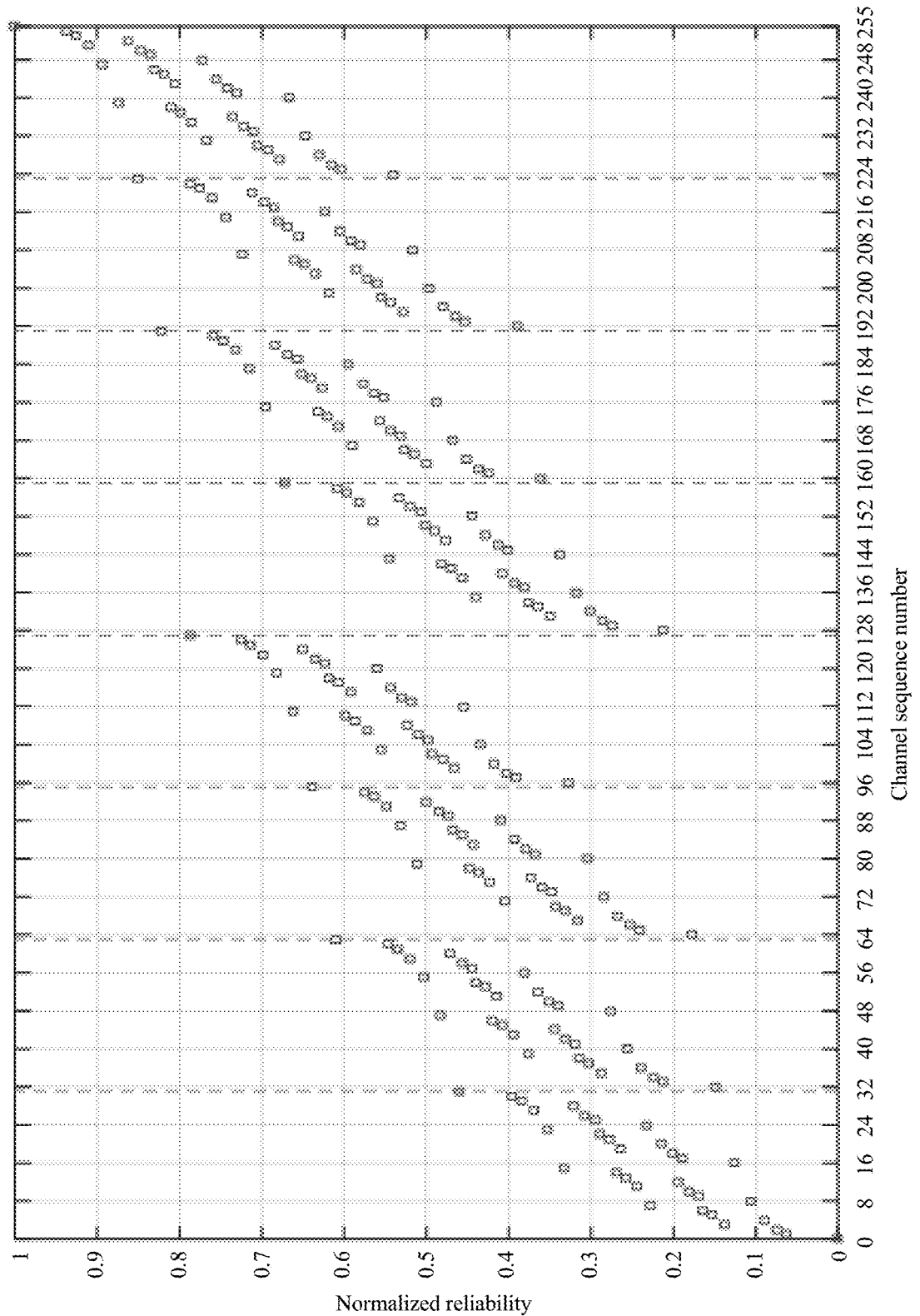
FIG. 2 is a schematic diagram of an embodiment of segmenting a to-be-encoded sequence based on an equal length according to this application.

It can be learned, through an analysis of reliability of polarized channels, that the reliability is distributed relatively regularly. Specifically, an entire sequence may be divided into several segments, and reliability distribution in all the segments is similar. For example, in FIG. 2, a polar code whose mother code length N is equal to 256 is used, and is divided into eight segments, and change trends in all the segments are similar. Therefore, in this application, parity check frozen bit location selection is decoupled from reliability calculation by using this feature, so that a process of determining a location and a value of a parity check frozen bit is simplified, thereby effectively improving processing efficiency.

For convenience, definitions of parameters that may be used in this application are first provided. Refer to Table 1.

TABLE 1

| | |
|---|---|
| K | Quantity of information bits |
| M | Length of an encoded bit sequence |
| N | Mother code length, equal to |
| R | Code rate (K/M) |
| F | Frozen bit location set |
| PF | PC frozen bit location set |
| n | |
| I | Information bit location set |

Optionally, information bits in Table 1 may further include a bit on which path extension needs to be performed on a decoding end, such as a padding bit or a CRC (cyclic redundancy check) bit.

Figure 3:
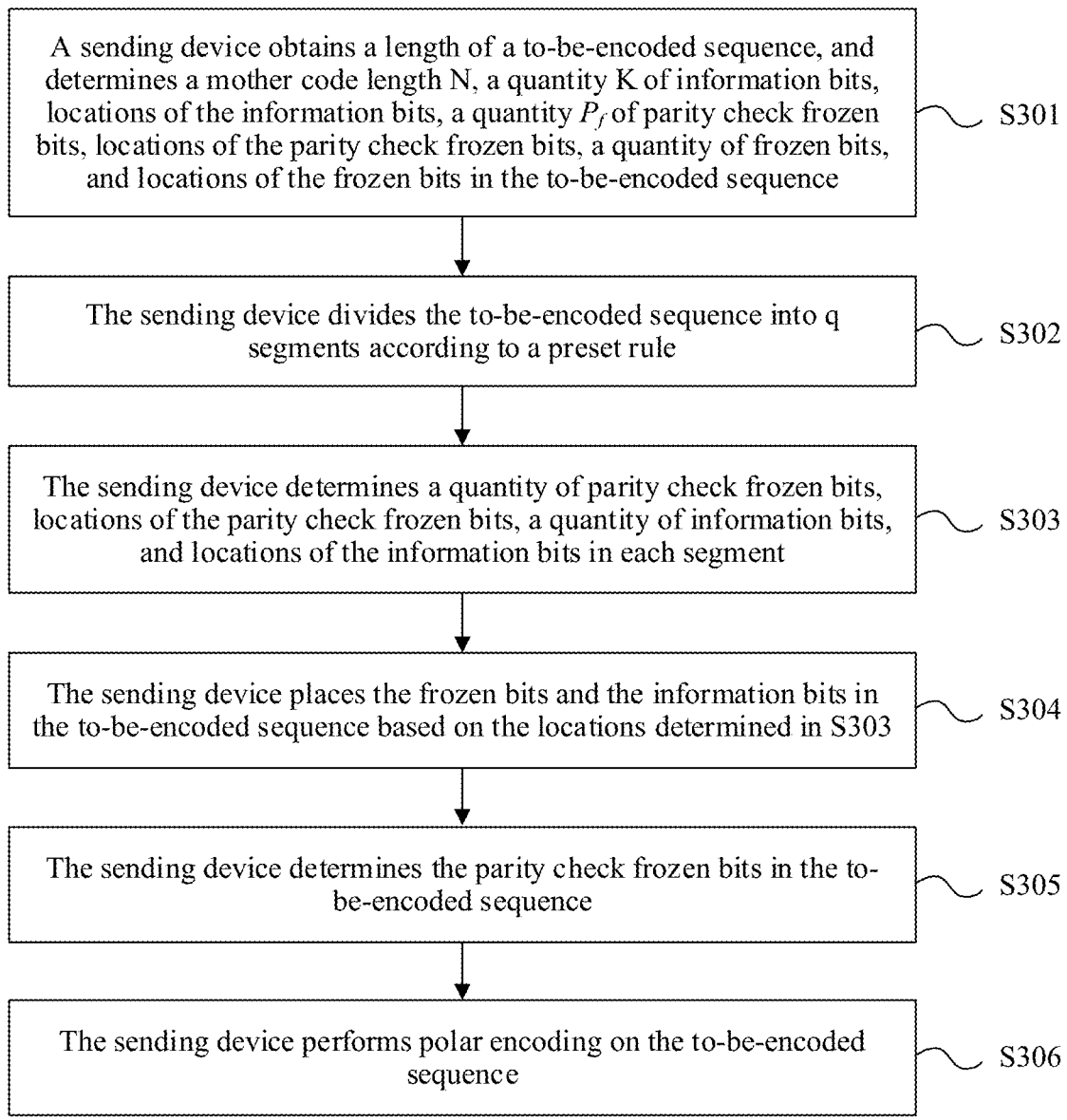
FIG. 3 is a schematic flowchart of an embodiment of a polar code encoding method according to this application.

FIG. 3 is a schematic flowchart of an encoding method according to this application. As shown in FIG. 3, based on the schematic application diagram shown in FIG. 1, a network device or a terminal may serve as a sending device or a receiving device. The method specifically includes the following steps.

S301. A sending device obtains a length N of a to-be-encoded sequence, a quantity K of information bits, locations of the information bits, a quantity $P_f$ of parity check frozen bits, locations of the parity check frozen bits, a quantity of frozen bits, and locations of the frozen bits in the to-be-encoded sequence.

A value of K is determined based on a code rate R and a length M of an encoded sequence, and K=M*R. The length (namely, a mother code length) of the to-be-encoded sequence is $N=2^{\lceil log_2(M) \rceil}$. Herein, $\lceil \ \rceil$ is a round-up function. Optionally, N may be determined by using a method for rounding $log_2M$ down.

A value of $P_f$ may be preset; or may be determined based on a function related to M and K, for example, may be determined by using Table 2. A first column represents K, a first row represents a code rate R, and a value in Table 2 represents a typical value of $P_f$.

TABLE 2

|     | 1/12 | 1/6 | 1/3 | 1/2 |
|-----|------|-----|-----|-----|
| 32  | 16   | 12  | 16  | 12  |
| 48  | 16   | 12  | 16  | 16  |
| 64  | 20   | 12  | 16  | 16  |
| 80  | 20   | 16  | 16  | 16  |
| 120 | 24   | 24  | 24  | 24  |
| 200 | 24   | 24  | 24  | 24  |

Table 2 is an example. A specific value selection method further depends on a rate matching scheme or another possible specific implementation. Generally, an optimal value of $P_f$ in an actual system is a positive integer in a range from a typical value in Table 2 minus 8 to the typical value plus 8.

Generally, in this application, an example in which the value of $P_f$ is preset is used. For example, $P_f$ is equal to a value such as 8, 16, 18, or 20.

Figure 4:
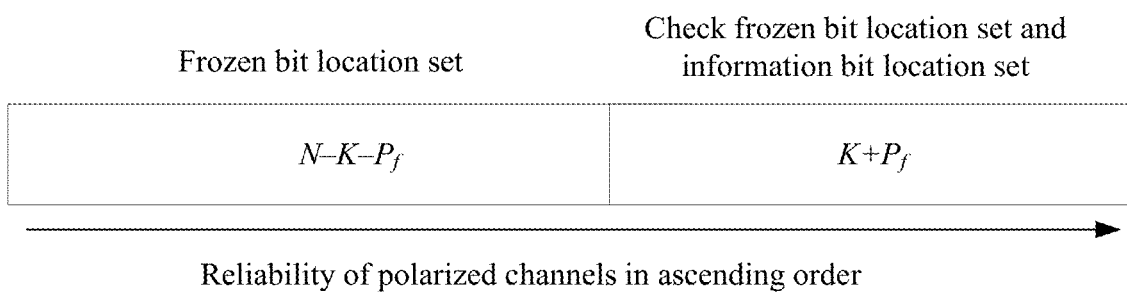
FIG. 4 is a schematic diagram of sorting a frozen bit location set, a parity check frozen bit location set, and an information bit location set based on reliability according to this application.

The method in this application is unrelated to a specific puncturing pattern, and a frozen bit is placed at a location of a punctured bit during encoding. Therefore, in this application, all locations of punctured bits are classified as frozen bit locations. A specific frozen bit value and the puncturing pattern only need to be agreed on by the sending device and a receiving device. This is not limited in this application. Therefore, the quantity of frozen bits is $(N-K-P_f)$. Locations in the to-be-encoded sequence that are sorted based on reliability are shown in FIG. 4, to be specific, locations with lowest reliability are selected. A reliability calculation method only needs to be agreed on by the sending device and the receiving device. This is also not limited in this application.

S302. The sending device divides the to-be-encoded sequence into q segments according to a preset rule.

It should be noted that, step S302 may be performed after N is determined, and does not necessarily need to be performed after a remaining operation in S301 is completed.

Optionally, the preset rule may be equally dividing N locations (namely, N polarized channels) in the to-be-encoded sequence into several segments based on sequence numbers. For example, the N locations are divided into $(q=2^v)$ segments, where v may be any positive integer less than n. For example, in FIG. 2, N=256, n=8, and v=3.

Figure 5:
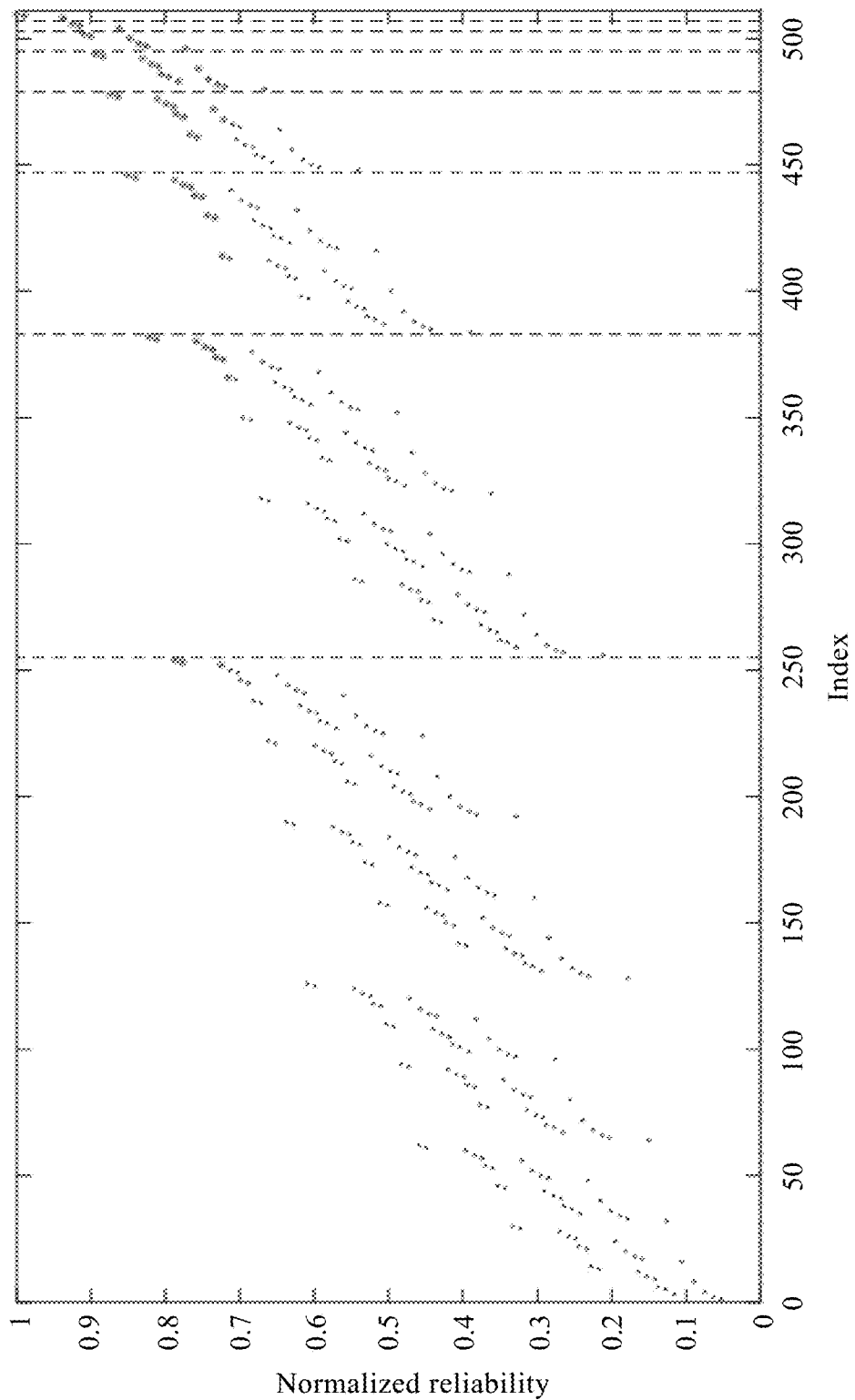
FIG. 5 is a schematic diagram of an embodiment of segmenting a to-be-encoded sequence based on an unequal length according to this application.

Optionally, the preset rule may be unequal-length segmentation shown in FIG. 5, where N=512, n=9, and q=8. In this example, each segment point is a last point of each segment, and a sequence number of a bit location of the segment point is Bt, where t=1, 2, . . . , or q−1. Sequence numbers are arranged from 0, and values of Bt are as follows:

A first segment point is $B_1=(011111111)_{BIN}=(255)_{DEC}$ (in other words, a first segment is from a location 0 to a location 255, and therefore the first segment includes 256 locations); a second segment point is $B_2=(101111111)_{BIN}=(383)_{DEC}$; a third segment point is $B_3=(110111111)_{BIN}=(447)_{DEC}$; a fourth segment point is $B_4=(111011111)_{BIN}=(479)_{DEC}$; a fifth segment point is $B_5=(111101111)_{BIN}=(495)_{DEC}$; a sixth segment point is $B_6=(111110111)_{BIN}=(503)_{DEC}$; and a seventh segment point is $B_7=(111111011)_{BIN}=(507)_{DEC}$, where BIN means binary notation, and DEC means decimal notation. Herein, the to-be-encoded sequence is divided into only (q=n−1=8) segments instead of (q=n=9) segments because an eighth segment includes only four points (508, 509, 510, and 511) according to this rule, and subdivision is meaningless. Certainly, the to-be-encoded sequence may be divided into (q=n=9) segments according to a value of n. In this case, $B_8=(111111101)_{BIN}=(509)_{DEC}$. According to this rule, the following general manner of obtaining a segment point may be obtained:

If the to-be-encoded sequence includes the q segments, a sequence number of a bit location of a $t^{th}$ segment point is Bt; when Bt is represented by using an n-bit binary number, a $t^{th}$ bit in the n-bit binary number is 0, and remaining (n−1) bits are all 1, where 0<t<q.

Optionally, segment points corresponding to different values of N may be pre-stored in a form of a table. For example, if q=n−1, and a value range of a sequence number of a bit location in the to-be-encoded sequence is any integer greater than or equal to 0 and less than N, when N=16, a set of sequence numbers of bit locations corresponding to segment points is [7, 11]; or when N=32, a set of sequence numbers of bit locations corresponding to segment points is [15, 23, 27]; or when N=64, a set of sequence numbers of bit locations corresponding to segment points is [31, 47, 55, 59]; or when N=128, a set of sequence numbers of bit locations corresponding to segment points is [63, 95, 111, 119, 123]; or when N=256, a set of sequence numbers of bit locations corresponding to segment points is [127, 191, 223, 239, 247, 251]; or when N=512, a set of sequence numbers of bit locations corresponding to segment points is [255, 383, 447, 479, 495, 503, 507]; or when N=1024, a set of sequence numbers of bit locations corresponding to segment points is [511, 767, 895, 959, 991, 1007, 1015, 1019]; or when N=2048, a set of sequence numbers of bit locations corresponding to segment points is [1023, 1535, 1791, 1919, 1983, 2015, 2031, 2039, 2043]; or when N=4096, a set of sequence numbers of bit locations corresponding to segment points is [2047, 3071, 3583, 3839, 3967, 4031, 4065, 4079, 4087, 4091].

If to-be-encoded bit locations are numbered from 1 to N, each element in the set of sequence numbers of bit locations corresponding to segment points needs to be increased by 1. Details are not described.

Figure 6:
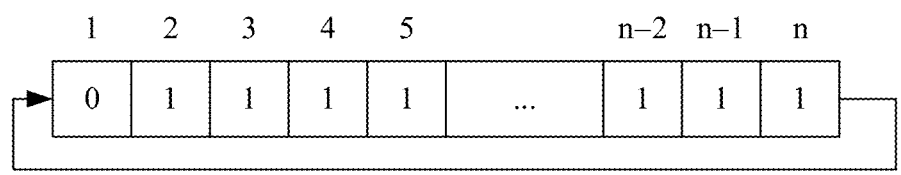
FIG. 6 is a schematic structural diagram of a shift register according to this application.

During specific implementation, alternatively, a segment point may be obtained by using a segment shift register. As shown in FIG. 6, first, a first bit is 0, and remaining bits are 1. Values in n registers are selected to obtain a first segment point, and then right cyclic shift is performed by one bit to obtain a next segment point, until all segment points are obtained to divide the to-be-encoded sequence into q segments.

S303. The sending device determines a quantity of parity check frozen bits, locations of the parity check frozen bits, a quantity of information bits, and locations of the information bits in each segment.

If segmentation is performed in an equal-length manner in S302, the locations of the parity check frozen bits may be selected according to the following steps:

Step PFa01: Obtain q, $P_f$, N, and a frozen bit location set.

Step PFa02: If $P_f > q$, perform PFa03; otherwise, perform PFa05.

Step PFa03: Select one bit location other than a frozen bit location in each of the q segments as a parity check frozen bit location, where one bit location with lowest reliability other than the frozen bit location in each segment may be selected, or one bit location with highest reliability other than the frozen bit location in each segment may be selected, or any bit location agreed on by the sending device and a receiving device is selected.

Step PFa04: If $P_f = P_f - q$, skip to step PFa02.

Step PFa05: Select $P_f$ segments with highest average reliability, and select one bit location other than a frozen bit location in each of the $P_f$ segments as a parity check frozen bit location, where one bit location with lowest reliability other than the frozen bit location and a selected parity check frozen bit location in the segment may be selected, or one bit location with highest reliability other than the frozen bit location and a selected parity check frozen bit location in the segment may be selected, or any bit location agreed on by the sending device and a receiving device is selected.

Step PFa06: The sending device determines a remaining location as an information bit location based on the parity check frozen bit location and the frozen bit location.

Optionally, when segmentation is performed in an equal-length manner, the parity check frozen bit location may alternatively be selected by using the following rule: All sets (a frozen bit set, a parity check frozen bit set, and an information bit set) are marked from a largest number in a bit location sequence. If both consecutive odd-even segments include a set other than the frozen bit set, locations of a fixed quantity of parity check frozen bits are selected from an odd-numbered segment of the two odd-even segments. If not both consecutive odd-even segments include a set other than the frozen bit set, a next pair of odd-even segments is jumped to. The foregoing operation is repeated until a specified value of the parity check frozen bit is reached. The fixed quantity may be preset. Certainly, the fixed quantity of parity check frozen bits may alternatively be selected from an even-numbered segment in the two odd-even segments.

Optionally, when segmentation is performed in an equal-length manner, the parity check frozen bit location may alternatively be selected by using the following rule: When the parity check frozen bit location is selected according to the foregoing method, only one parity check frozen bit location is selected from each segment selected in a first round. In a second round, a length of each segment is doubled. In other words, a quantity of segments is halved. A parity check frozen bit location is selected, according to the method in the first round, from segments after halving, and so on, until all parity check frozen bit locations are selected.

The sending device and the receiving device only need to agree on a specific used selection manner and whether to select the parity check frozen bit location in each selected segment based on highest reliability or lowest reliability.

If segmentation is performed in an unequal-length manner in S302, for example, if a segment point is determined by using the foregoing cyclic shift register, after the segment point is determined, the parity check frozen bit in each segment may be determined according to the following steps:

Step PFb01: Obtain q, $P_f$, N, and a frozen bit location set.

Step PFb02: Determine a quantity $G_g$ of locations other than frozen bit locations in a $g^{th}$ segment, where $G_g$ is a nonnegative integer, g is a positive integer, and $0 < g \leq q$. It should be noted that $G_g$ may be 0, and the locations include an information bit location and a parity check frozen bit location.

Step PFb03: Determine a quantity of parity check frozen bits in the $g^{th}$ segment according to the following formula: $P_{fg} = \text{round}(P_f * G_g / (K + P_f))$, where round is a rounding operation. Therefore, $P_{fg}$ may be 0. The quantity of parity check frozen bits in the $g^{th}$ segment may alternatively be determined by using another function, for example, in a rounding manner; or in a manner of allocating the parity check frozen bits as averagely as possible, where the manner is similar to equal-length segmentation; or in any allocation manner agreed on by the sending device and a receiving device.

Step PFb04: Determine that parity check frozen bit locations in the $g^{th}$ segment are $P_{fg}$ bit locations with smallest bit location sequence numbers other than frozen bit locations in the $g^{th}$ segment; or parity check frozen bit locations in the $g^{th}$ segment are $P_{fg}$ bit locations with largest bit location sequence numbers other than frozen bit locations in the $g^{th}$ segment; or parity check frozen bit locations in the $g^{th}$ segment are $P_{fg}$ bit locations that are agreed on by the sending device and the receiving device and that are other than frozen bit locations in the $g^{th}$ segment.

Step PFb05: The sending device determines a remaining location as the information bit location based on the parity check frozen bit location and the frozen bit location.

For example, according to step PFb01 to step PFb05, the frozen bit location, the parity check frozen bit location, and the information bit location are determined in a sequence whose length N is 512. It is assumed that K=40, $P_f$ is set to 16, and location sequence numbers are from 0 to 511. In this case, $G_g = K + P_f = 56$, n=9, and q=n−1=8. After (512−56=456) frozen bit (including a punctured bit, a shortened bit, and the like) locations are determined in a polar code polarization weight reliability calculation manner, a set Q of information bit locations and parity check frozen bit locations is as follows:

Q=[252, 253, 254|366, 373, 374, 377, 378, 380, 381, 382|414, 429, 430, 437, 438, 441, 442, 444, 445, 446,|461, 462, 468, 469, 470, 472, 473, 474, 476 477, 478,|481, 482, 483, 484, 485, 486, 488, 489, 490, 492, 493, 494|496, 497, 498, 500, 501, 502|504, 505, 506|508, 509, 510], where "|" is a segment mark. In this case, $G_1=3$, $G_2=8$, $G_3=10$, $G_4=11$, $G_5=12$, $G_6=6$, $G_7=3$, and $G_8=3$.

Therefore, the quantity $P_{fg}$ in each segment can be obtained: $P_{fg} = \text{round}(P_f * G_g / (K + P_f))$, where g=1, 2, 3, 4, 5, 6, 7, or 8.

$P_{f1}=1$; $P_{f2}=2$; $P_{f3}=3$; $P_{f4}=3$; $P_{f5}=3$; $P_{f6}=2$; $P_{f7}=1$; and $P_{f8}=1$.

It is assumed that $P_{fg}$ parity check frozen bits are $P_{fg}$ leftmost bits in each segment of the set Q of information bit locations and parity check frozen bit locations. Therefore, a set $Q_{PF}$ of parity check frozen bit locations is as follows:

$Q_{PF}$=[252, 366, 373, 414, 429, 430, 468, 472, 461, 481, 482, 484, 496, 497, 504, 508].

Correspondingly, a set of locations, in the set Q, other than the locations represented by $Q_{PF}$ is a set of information bit locations.

S304. The sending device places the frozen bits and the information bits in the to-be-encoded sequence based on the locations determined in S303.

S305. The sending device determines the parity check frozen bits in the to-be-encoded sequence.

It is assumed that the to-be-encoded sequence is [$u_0$, $u_1$, $u_2$, ..., and $u_{N-1}$]. The frozen bits and the information bits are successively placed in the to-be-encoded sequence based on the locations in the foregoing step, a value of at least one of the parity check frozen bits is determined based on at least one of the frozen bit and the information bit; or a value of at least one of the parity check frozen bits is a preset value.

Figure 7:
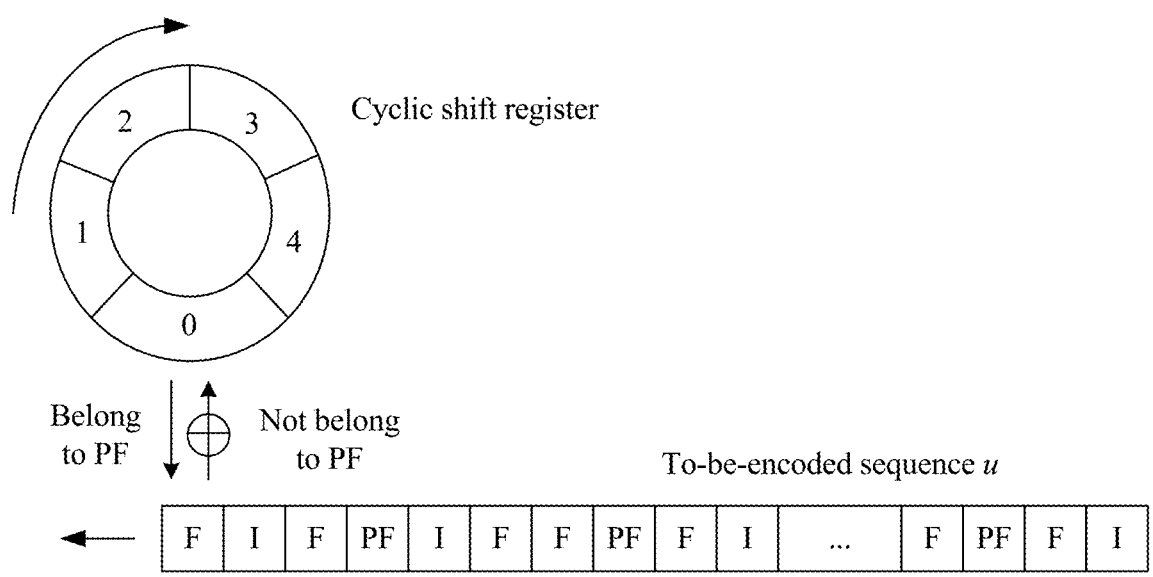
FIG. 7 is a schematic diagram of an example of determining a value of a parity check frozen bit according to this application.

Optionally, the value of the parity check frozen bit is obtained in the following manner:

The sending device successively performs interaction operations with a cyclic shift register in order based on elements in the to-be-encoded sequence u, where the cyclic shift register rotates by one bit in a fixed direction (clockwise or counterclockwise) after each operation, a length of the cyclic shift register is p, initial states y[0], y[1], ..., and y[p−1] of the cyclic shift register are a known binary sequence with a length of p, and p is a positive integer and a prime number. In this case, the following operations are performed during interaction:

If a location of $u_i$ is not the parity check frozen bit (PF) location, y[x]=XOR y[x]); or if a location of $u_i$ is the parity check frozen bit (PF) location, the parity check frozen bit is $u_i$=y[x], where i=0, 1, ..., or N−1, y[x] is a state of an $x^{th}$ register unit in the cyclic shift register, 0≤x≤p−1, and i and x are integers. The sequence is a sequence from left to right or from right to left, or is any sequence agreed on by the sending device and the receiving device. The fixed direction is clockwise or counterclockwise. A specific example may be shown in FIG. 7, where x=0, the sequence is from left to right, and the fixed direction is clockwise.

It should be noted herein that only whether the location of $u_i$ is the parity check frozen bit (PF) location is distinguished, and the frozen bits do not need to be excluded first. Therefore, a determining operation is simplified, and a limitation that all frozen bits need to be zero when the frozen bits are first excluded during polar code encoding performed by using the parity check frozen bit is imperceptibly relieved.

S306. The sending device performs polar code encoding on the to-be-encoded sequence.

Figure 8:
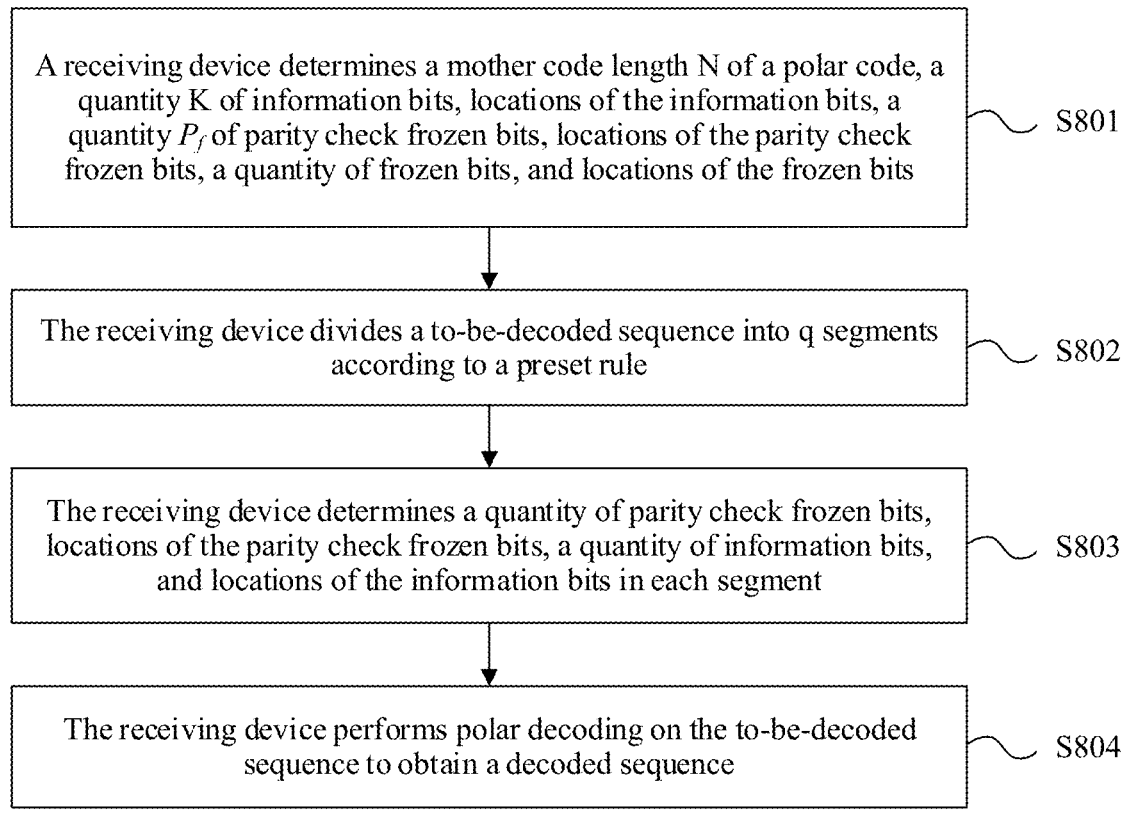
FIG. 8 is a schematic flowchart of an embodiment of a polar code decoding method according to this application.

FIG. 8 is a schematic diagram of an embodiment of a polar code decoding method according to this application.

S801. A receiving device obtains a mother code length N of a polar code used for decoding, a quantity K of information bits, locations of the information bits, a quantity $P_f$ of parity check frozen bits, locations of the parity check frozen bits, a quantity of frozen bits, and locations of the frozen bits.

A value of K is determined based on a code rate R and a length M of an encoded sequence, and K=M*R. A length (namely, the mother code length) of a to-be-decoded sequence is N=$2^{\lceil log_2(M) \rceil}$. Herein, ⌈ ⌉ is a round-up function. Optionally, N may be determined by using a method for rounding $log_2 M$ down.

A value of $P_f$ may be preset, or may be determined according to Table 2 and N. It should be noted that a length of an actually transmitted sequence is M. Herein, a frozen bit agreed on by a transmit end and a receive end is also added to a received sequence based on a corresponding location during decoding, so that the length of the to-be-decoded sequence is restored to N. This processing manner is not substantially different from a manner of directly processing a received sequence whose length is M. Therefore, in this application, a sequence whose length is N is still described.

S802. The receiving device divides a to-be-decoded sequence into q segments according to a preset rule.

Herein, the preset rule is similar to that of the sending device. Therefore, determining may be performed with reference to a manner in S302. Details are not described herein again.

S803. The receiving device determines a quantity of parity check frozen bits, locations of the parity check frozen bits, a quantity of information bits, and locations of the information bits in each segment.

Herein, a determining method is similar to that of the sending device. Therefore, determining may be performed with reference to a method in S303. Details are not described herein again.

S804. The receiving device performs polar code decoding on the to-be-decoded sequence to obtain a decoded sequence.

Herein, a polar code decoding method is similar to an existing PC-Polar code decoding manner, and the parity check frozen bit may assist in decoding. Details are not described herein again.

Figure 9:
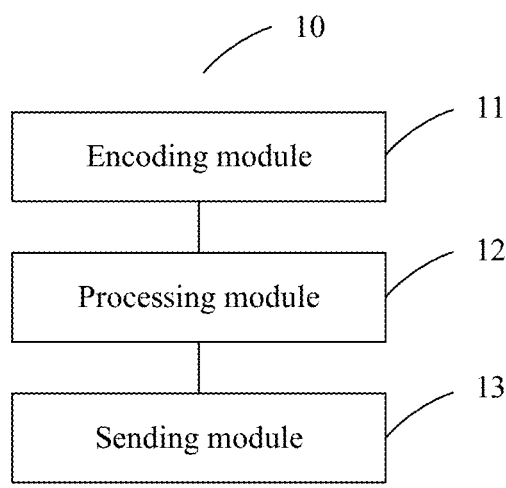
FIG. 9 is a schematic structural diagram of an embodiment of a sending apparatus according to this application.

FIG. 9 is a schematic diagram of a polar code encoding apparatus 10 according to this application. The apparatus 10 includes:

an encoding module 11, configured to perform polar code encoding on a to-be-encoded sequence, where a mother code length of a polar code is N, the to-be-encoded sequence includes frozen bits, parity check frozen bits, and information bits, the to-be-encoded sequence includes q segments, N=$2^n$, n and q are positive integers, and q=n or q<n;

a processing module 12, configured to determine a value of at least one of the parity check frozen bits based on at least one of the frozen bit and the information bit; or configured to determine that a value of at least one of the parity check frozen bits is a preset value; and a sending module 13, configured to send an encoded sequence.

Optionally, the processing module 12 is further configured to divide the to-be-encoded sequence into the q segments. A segmentation method is consistent with that in S302 in the foregoing method embodiment. Details are not described again.

Optionally, the processing module 12 is further configured to determine a quantity of parity check frozen bits and locations of the parity check frozen bits in each of the q segments. A determining method is consistent with that in S303 in the foregoing method embodiment. Details are not described again.

Optionally, the processing module 12 is further configured to determine the parity check frozen bit in the to-be-encoded sequence according to the methods described in S304 and S305 in the method embodiment.

Figure 10:
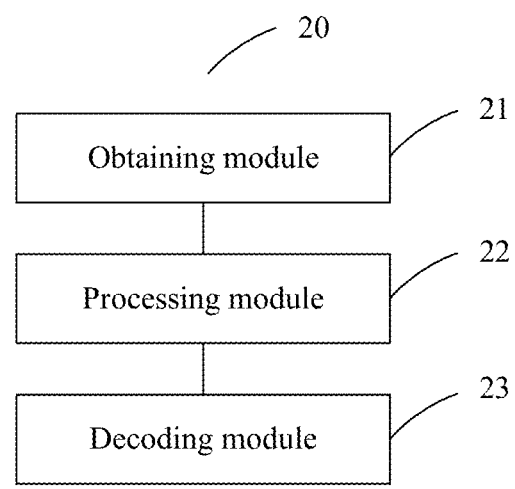
FIG. 10 is a schematic structural diagram of an embodiment of a receiving apparatus according to this application.

FIG. 10 is a schematic diagram of a polar code decoding apparatus 20 to this application. The apparatus 20 includes:

an obtaining module 21, configured to obtain a to-be-decoded sequence;

a decoding module 23, configured to perform polar code decoding on the received to-be-decoded sequence to obtain a decoded sequence, where a mother code length of a polar code is N, a length of the to-be-decoded sequence is N, the to-be-decoded sequence includes frozen bits, parity check frozen bits, and information bits, the to-be-decoded sequence includes q segments, N=$2^n$, n and q are positive integers, and q=n or q<n; and a processing module 22, configured to divide the to-be-decoded sequence into the q segments according to a preset rule. A segmentation method is consistent with that in S802 in the foregoing method embodiment. Details are not described again.

Optionally, the processing module 22 is further configured to determine a quantity of parity check frozen bits, locations of the parity check frozen bits, a quantity of information bits, and locations of the information bits in each segment. A determining method is consistent with that in S803 in the foregoing method embodiment. Details are not described again.

Figure 11:
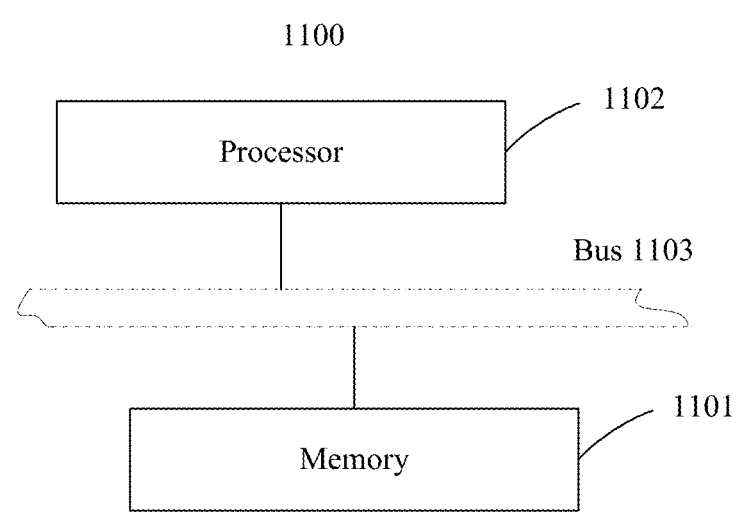
FIG. 11 is a schematic structural diagram of an embodiment of an encoding entity apparatus according to this application.

FIG. 11 is a schematic diagram of an encoding entity apparatus 1100 according to this application. The apparatus 1100 includes:

a memory 1101, configured to store an executable instruction, where the memory 1101 may be a flash memory; and a processor 1102, configured to execute the executable instruction stored in the memory, to implement the steps in the encoding method shown in FIG. 3. For details, refer to related descriptions in the foregoing method embodiment.

Optionally, the memory 1101 may be independent, or may be integrated with the processor 1102.

When the memory 1101 is a component independent of the processor 1102, the apparatus 1100 may further include:

a bus 1103, configured to connect the memory 1101 and the processor 1102. The encoding apparatus 1100 in FIG. 11 may further include a transmitter (not shown in the figure), configured to send an encoded sequence that is obtained after the processor 1102 performs polar code encoding.

Figure 12:
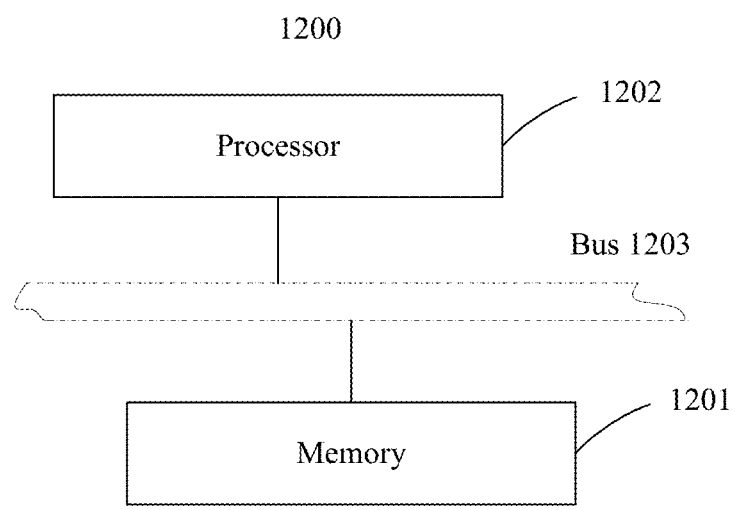
FIG. 12 is a schematic structural diagram of an embodiment of a decoding entity apparatus according to this application.

FIG. 12 is a schematic diagram of a decoding entity apparatus 1200 according to this application. The apparatus 1200 includes:

a memory 1201, configured to store an executable instruction, where the memory 1201 may be a flash memory; and a processor 1202, configured to execute the executable instruction stored in the memory, to implement the steps in the decoding method shown in FIG. 8. For details, refer to related descriptions in the foregoing method embodiment.

Optionally, the memory 1201 may be independent, or may be integrated with the processor 1202.

When the memory 1201 is a component independent of the processor 1202, the apparatus 1200 may further include:

a bus 1203, configured to connect the memory 1201 and the processor 1202.

The decoding apparatus 1200 in FIG. 12 may further include a receiver (not shown in the figure), configured to: receive a to-be-decoded signal, and send the to-be-decoded signal to the processor 1202.

This application further provides a readable storage medium. The readable storage medium stores an executable instruction. When at least one processor of a sending device executes the executable instruction, the sending device performs the polar code encoding method provided in the foregoing implementations.

This application further provides a readable storage medium. The readable storage medium stores an executable instruction. When at least one processor of a receiving device executes the executable instruction, the receiving device performs the polar code decoding method provided in the foregoing implementations.

This application further provides a program product. The program product includes an executable instruction, and the executable instruction is stored in a readable storage medium. At least one processor of a sending device can read the executable instruction from the readable storage medium, and the at least one processor executes the executable instruction, so that the sending device implements the polar code encoding method provided in the foregoing implementations.

This application further provides a program product. The program product includes an executable instruction, and the executable instruction is stored in a readable storage medium. At least one processor of a receiving device can read the executable instruction from the readable storage medium, and the at least one processor executes the executable instruction, so that the receiving device implements the polar code decoding method provided in the foregoing implementations.

In the foregoing embodiment of the sending device or the receiving device, it should be understood that the processor may be a central processing unit (CPU), or may be another general purpose processor, a digital signal processor (DSP), an application-specific integrated circuit (ASIC), or the like. The general purpose processor may be a microprocessor, or the processor may be any conventional processor or the like. The steps of the methods disclosed with reference to this application may be directly performed by a hardware processor, or may be performed by using a combination of hardware in the processor and a software module.

All or some steps of the foregoing method embodiments may be implemented by a program instructing related hardware. The foregoing program may be stored in a readable memory. When the program is executed, the steps of the foregoing method embodiments are performed. The memory (storage medium) includes a read-only memory (ROM), a RAM, a flash memory, a hard disk, a solid state disk, a magnetic tape, a floppy disk, an optical disc, and any combination thereof.

Finally, it should be noted that, although the solutions are described in detail with reference to the foregoing embodiments, persons of ordinary skill in the art should understand that they may still make modifications to the technical solutions recorded in the foregoing embodiments or make equivalent replacements to some or all technical features thereof, without departing from the scope of the technical solutions of the embodiments of this application.

What is claimed is:

1. A polar code encoding method comprising:

obtaining, by a hardware processor of a sending device, a to-be-encoded sequence which comprises frozen bits, parity check frozen bits, and information bits, wherein a mother code length of the to-be-encoded sequence is N, and N is a positive integer;

determining, by the hardware processor of the sending device, a quantity K of the information bits, based on a code rate R and K=M*R, and N=$2^{\lceil log_2(M) \rceil}$, $\lceil \ \rceil$ is a round-up function; and determining, a quantity $P_f$ of the parity check frozen bits based on a function related to M and K or obtaining a preset quantity $P_f$;

obtaining, by the hardware processor of the sending device, locations of the information bits, locations of the parity check frozen bits in the to-be-encoded sequence;

dividing the to-be-encoded sequence in to q segments, wherein N=$2^n$, n and q are positive integers, and q=n or q<n;

for each segment, determining, a quantity and locations of parity check frozen bits, and a quantity and locations of information bits;

allocating the frozen bits and the information bits of the to-be-encoded sequence into the determined locations of the parity check frozen bits and the information bits in each segment;

determining, a value of at least one of the parity check frozen bits based on at least one of the frozen bits and the information bits; or determining that a value of at least one of the parity check frozen bits is preset;

performing, by the hardware processor of sending device, polar code encoding on the to-be-encoded sequence based on the determined value of the at least one parity check frozen bit and the relocations of the frozen bits and the information bits in each segment; and sending, by the hardware processor of the sending device, an encoded sequence.

2. The method according to claim 1, wherein a sequence number of a bit location of a $t^{th}$ segment point is Bt; in response to Bt being represented using an n-bit binary number, a $t^{th}$ bit in the n-bit binary number is 0, and remaining (n−1) bits are all 1; and 0<t<q.

3. The method according to claim 1, wherein a value range of a sequence number of a bit location in the to-be-encoded sequence is any integer greater than or equal to 0 and less than N; and in response to N=16, a set of sequence numbers of bit locations corresponding to segment points is [7, 11]; or in response to N=32, a set of sequence numbers of bit locations corresponding to segment points is [15, 23, 27]; or in response to N=64, a set of sequence numbers of bit locations corresponding to segment points is [31, 47, 55, 59]; or in response to N=128, a set of sequence numbers of bit locations corresponding to segment points is [63, 95, 111, 119, 123]; or in response to N=256, a set of sequence numbers of bit locations corresponding to segment points is [127, 191, 223, 239, 247, 251]; or in response to N=512, a set of sequence numbers of bit locations corresponding to segment points is [255, 383, 447, 479, 495, 503, 507]; or in response to N=1024, a set of sequence numbers of bit locations corresponding to segment points is [511, 767, 895, 959, 991, 1007, 1015, 1019]; or in response to N=2048, a set of sequence numbers of bit locations corresponding to segment points is [1023, 1535, 1791, 1919, 1983, 2015, 2031, 2039, 2043]; or in response to N=4096, a set of sequence numbers of bit locations corresponding to segment points is [2047, 3071, 3583, 3839, 3967, 4031, 4065, 4079, 4087, 4091].

4. The method according to claim 1, wherein a quantity $P_{fg}$ of parity check frozen bits in a $g_{th}$ segment in each of the q segments is $P_{fg}$=round($P_f*G_g/(K+P_f)$), wherein round is a rounding operation, $P_f$ is a quantity of parity check frozen bits, $G_g$ is a sum of a quantity of information bits and a quantity of parity check frozen bits in a $g^{th}$ segment, K is a quantity of information bits, wherein $P_f$, g, and K are all positive integers, $G_g$ and $P_{fg}$ are nonnegative integers, and 0<g≤q.

5. The method according to claim 4, wherein parity check frozen bit locations in the $g^{th}$ segment are $P_{fg}$ bit locations with smallest bit location sequence numbers other than frozen bit locations in the $g^{th}$ segment.

6. The method according to claim 1, wherein the to-be-encoded sequence is $[u_0, u_1, u_2, \ldots,$ and $u_{N-1}]$; the value of the at least one of the parity check frozen bits is determined based on at least one of the frozen bit and the information bit, or the value of the at least one of the parity check frozen bits is the preset value; and the value of the parity check frozen bit is obtained by performing the following operations:

successively performing, by the sending device, interaction operations with a cyclic shift register in order based on elements in the to-be-encoded sequence $[u_0, u_1, u_2, \ldots,$ and $u_{N-1}]$, wherein the cyclic shift register rotates by one bit in a fixed direction after each operation, a length of the cyclic shift register is p, initial states y[0], y[1], . . . , and y[p−1] of the cyclic shift register are a known binary sequence with a length of p, and p is a positive integer and a prime number; and in response to a location of $u_i$ being not the parity check frozen bit location, y[x]=($u_i$ XOR y[x]); or in response to a location of $u_i$ being the parity check frozen bit location, the parity check frozen bit is $u_i$=y[x], wherein i=0, 1, . . . , or N−1, y[x] is a state of an $x^{th}$ register unit in the cyclic shift register, 0≤x≤p−1, and i and x are integers.

7. A polar code encoding apparatus comprising:

at least one processor;

a non-transitory memory coupled to the at least one processor and storing processor-executable instructions for execution by the at least one processor, the execution instructions instructing the at least one processor to:

obtain a to-be-encoded sequence which comprises frozen bits, parity check frozen bits, and information bits, wherein a mother code length of the to-be-encoded sequence is N, and N is a positive integer;

determine, a quantity K of the information bits, based on a code rate R and K=M*R, and N=$2^{\lceil log_2(M) \rceil} 2^{\lceil log_2(M) \rceil} 2^{\lceil log_q(M) \rceil}$, $\lceil\ \rceil$ is a round-up function; and determine, a quantity $P_f$ of the parity check frozen bits based on a function related to M and K or obtaining a preset quantity $P_f$;

obtain, locations of the information bits, locations of the parity check frozen bits in the to-be-encoded sequence;

divide the to-be-encoded sequence in to q segments, wherein N=$2^n$, n and q are positive integers, and q=n or q<n;

for each segment, determine, a quantity and locations of parity check frozen bits, and a quantity and locations of information bits;

allocate the frozen bits and the information bits of the to-be-encoded sequence into the determined locations of the parity check frozen bits and the information bits in each segment;

determine, a value of at least one of the parity check frozen bits based on at least one of the frozen bits and the information bits; or determine that a value of at least one of the parity check frozen bits is preset;

perform polar code encoding on the to-be-encoded sequence based on the determined value of the at least one parity check frozen bit and the relocations of the frozen bits and the information bits in each segment;

send an encoded sequence.

8. The apparatus according to claim 7, wherein a sequence number of a bit location of a $t^{th}$ segment point is Bt; when Bt is represented using an n-bit binary number, a $t^{th}$ bit in the n-bit binary number is 0, and remaining (n−1) bits are all 1; and 0<t<q.

9. The apparatus according to claim 7, wherein a value range of a sequence number of a bit location in the to-be-encoded sequence is any integer greater than or equal to 0 and less than N; and when N=16, a set of sequence numbers of bit locations corresponding to segment points is [7, 11]; or when N=32, a set of sequence numbers of bit locations corresponding to segment points is [15, 23, 27]; or when N=64, a set of sequence numbers of bit locations corresponding to segment points is [31, 47, 55, 59]; or when N=128, a set of sequence numbers of bit locations corresponding to segment points is [63, 95, 111, 119, 123]; or when N=256, a set of sequence numbers of bit locations corresponding to segment points is [127, 191, 223, 239, 247, 251]; or when N=512, a set of sequence numbers of bit locations corresponding to segment points is [255, 383, 447, 479, 495, 503, 507]; or when N=1024, a set of sequence numbers of bit locations corresponding to segment points is [511, 767, 895, 959, 991, 1007, 1015, 1019]; or when N=2048, a set of sequence numbers of bit locations corresponding to segment points is [1023, 1535, 1791, 1919, 1983, 2015, 2031, 2039, 2043]; or when N=4096, a set of sequence numbers of bit locations corresponding to segment points is [2047, 3071, 3583, 3839, 3967, 4031, 4065, 4079, 4087, 4091].

10. The apparatus according to claim 7, wherein a quantity $P_{fg}$ of parity check frozen bits in a $g_{th}$ segment in the q segments is $P_{fg}=\text{round}(P_f*G_g/(K+P_f))$, wherein round is a rounding operation, $P_f$ is a quantity of parity check frozen bits, $G_g$ is a sum of a quantity of information bits and a quantity of parity check frozen bits in a $g^{th}$ segment, K is a quantity of information bits, wherein $P_f$, g, and K are all positive integers, $G_g$ and $P_{fg}$ are nonnegative integers, and $0<g\leq q$.

11. The apparatus according to claim 10, wherein
parity check frozen bit locations in the $g^{th}$ segment are $P_{fg}$ bit locations with smallest bit location sequence numbers other than frozen bit locations in the $g^{th}$ segment; or
parity check frozen bit locations in the $g^{th}$ segment are $P_{fg}$ bit locations with largest bit location sequence numbers other than frozen bit locations in the $g^{th}$ segment; or
parity check frozen bit locations in the $g^{th}$ segment are $P_{fg}$ bit locations that are agreed on by the apparatus and a receiving device and that are other than frozen bit locations in the $g^{th}$ segment.

12. The apparatus according to claim 7, wherein
the to-be-encoded sequence is $[u_0, u_1, u_2, \ldots, \text{and } u_{N-1}]$;
the value of the at least one of the parity check frozen bits is determined based on at least one of the frozen bit and the information bit, or the value of the at least one of the parity check frozen bits is the preset value; and the value of the parity check frozen bit is obtained by the at least one processor by successively performing interaction operations with a cyclic shift register in order based on elements in the to-be-encoded sequence $[u_0, u_1, u_2, \ldots, \text{and } u_{N-1}]$, wherein the cyclic shift register rotates by one bit in a fixed direction after each operation, a length of the cyclic shift register is p, initial states $y[0], y[1], \ldots, \text{and } y[p-1]$ of the cyclic shift register are a known binary sequence with a length of p, and p is a positive integer and a prime number; and
if a location of $u_i$ is not the parity check frozen bit location, $y[x]=(u_i \text{ XOR } y[x])$; or if a location of $u_i$ is the parity check frozen bit location, the parity check frozen bit is $u_i=y[x]$, wherein
$i=0, 1, \ldots, \text{or } N-1$, $y[x]$ is a state of an $x^{th}$ register unit in the cyclic shift register, $0\leq x\leq p-1$, and i and x are integers.

13. A non-transitory computer-readable storage medium, storing processor-executable instructions which when executed by at least one processor of a sending device, cause the sending device to:

obtain a to-be-encoded sequence which comprises frozen bits, parity check frozen bits, and information bits, wherein a mother code length of the to-be-encoded sequence is N, and N is a positive integer;

determine, a quantity K of the information bits, based on a code rate R and K=M*R, and $N=2^{\lceil log_2(M) \rceil}$, $\lceil \ \rceil$ is a round-up function; and determine, a quantity $P_f$ of the parity check frozen bits based on a function related to M and K or obtaining a preset quantity $P_f$;

obtain, locations of the information bits, locations of the parity check frozen bits in the to-be-encoded sequence;

divide the to-be-encoded sequence in to q segments, wherein $N=2^n$, n and q are positive integers, and q=n or q<n;

for each segment, determine, a quantity and locations of parity check frozen bits, and a quantity and locations of information bits;

allocate the frozen bits and the information bits of the to-be-encoded sequence into the determined locations of the parity check frozen bits and the information bits in each segment;

determine, a value of at least one of the parity check frozen bits based on at least one of the frozen bits and the information bits; or determine that a value of at least one of the parity check frozen bits is preset;

perform polar code encoding on the to-be-encoded sequence based on the determined value of the at least one parity check frozen bit and the relocations of the frozen bits and the information bits in each segment; and send an encoded sequence.

14. The non-transitory computer-readable storage medium according to claim 13, wherein a sequence number of a bit location of a $t^{th}$ segment point is Bt; when Bt is represented using an n-bit binary number, a $t^{th}$ bit in the n-bit binary number is 0, and remaining (n−1) bits are all 1; and $0<t<q$.

15. The non-transitory computer-readable storage medium according to claim 13, wherein a value range of a sequence number of a bit location in the to-be-encoded sequence is any integer greater than or equal to 0 and less than N; and when N=16, a set of sequence numbers of bit locations corresponding to segment points is [7, 11]; or when N=32, a set of sequence numbers of bit locations corresponding to segment points is [15, 23, 27]; or when N=64, a set of sequence numbers of bit locations corresponding to segment points is [31, 47, 55, 59]; or when N=128, a set of sequence numbers of bit locations corresponding to segment points is [63, 95, 111, 119, 123]; or when N=256, a set of sequence numbers of bit locations corresponding to segment points is [127, 191, 223, 239, 247, 251]; or when N=512, a set of sequence numbers of bit locations corresponding to segment points is [255, 383, 447, 479, 495, 503, 507]; or when N=1024, a set of sequence numbers of bit locations corresponding to segment points is [511, 767, 895, 959, 991, 1007, 1015, 1019]; or when N=2048, a set of sequence numbers of bit locations corresponding to segment points is [1023, 1535, 1791, 1919, 1983, 2015, 2031, 2039, 2043]; or when N=4096, a set of sequence numbers of bit locations corresponding to segment points is [2047, 3071, 3583, 3839, 3967, 4031, 4065, 4079, 4087, 4091].

16. The non-transitory computer-readable storage medium according to claim 13, wherein a quantity $P_{fg}$ of parity check frozen bits in a $g_{th}$ segment in the q segments is $P_{fg}$=round($P_f*G_g/(K+P_f)$), wherein round is a rounding operation, $P_f$ is a quantity of parity check frozen bits, $G_g$ is a sum of a quantity of information bits and a quantity of parity check frozen bits in a $g^{th}$ segment, K is a quantity of information bits, wherein $P_f$, g, and K are all positive integers, $G_g$ and $P_{fg}$ are nonnegative integers, and $0<g\leq q$.

17. The non-transitory computer-readable storage medium according to claim 16, wherein
parity check frozen bit locations in the $g^{th}$ segment are $P_{fg}$ bit locations with smallest bit location sequence numbers other than frozen bit locations in the $g^{th}$ segment; or
parity check frozen bit locations in the $g^{th}$ segment are $P_{fg}$ bit locations with largest bit location sequence numbers other than frozen bit locations in the $g^{th}$ segment; or
parity check frozen bit locations in the $g^{th}$ segment are $P_{fg}$ bit locations that are agreed on by the apparatus and a receiving device and that are other than frozen bit locations in the $g^{th}$ segment.

18. The non-transitory computer-readable storage medium according to claim 13, wherein
the to-be-encoded sequence is $[u_0, u_1, u_2, \ldots,$ and $u_{N-1}]$;
the value of the at least one of the parity check frozen bits is determined based on at least one of the frozen bit and the information bit, or the value of the at least one of the parity check frozen bits is the preset value; and
the value of the parity check frozen bit is obtained by the at least one processor by successively performing interaction operations with a cyclic shift register in order based on elements in the to-be-encoded sequence $[u_0, u_1, u_2, \ldots,$ and $u_{N-1}]$, wherein the cyclic shift register rotates by one bit in a fixed direction after each operation, a length of the cyclic shift register is p, initial states $y[0], y[1], \ldots,$ and $y[p-1]$ of the cyclic shift register are a known binary sequence with a length of p, and p is a positive integer and a prime number; and
if a location of $u_i$ is not the parity check frozen bit location, $y[x]=(u_i$ XOR $y[x])$; or if a location of $u_i$ is the parity check frozen bit location, the parity check frozen bit is $u_i=y[x]$, wherein
$i=0, 1, \ldots,$ or $N-1$, $y[x]$ is a state of an $x^{th}$ register unit in the cyclic shift register, $0\leq x\leq p-1$, and i and x are integers.

19. The method according to claim 4, wherein
parity check frozen bit locations in the $g^{th}$ segment are $P_{fg}$ bit locations with largest bit location sequence numbers other than frozen bit locations in the $g^{th}$ segment.

20. The method according to claim 4, wherein
parity check frozen bit locations in the $g^{th}$ segment are $P_{fg}$ bit locations that are agreed on by the sending device and a receiving device and that are other than frozen bit locations in the $g^{th}$ segment.

* * * * *

UNITED STATES PATENT AND TRADEMARK OFFICE
CERTIFICATE OF CORRECTION

PATENT NO. : 11,050,508 B2
APPLICATION NO. : 16/522386
DATED : June 29, 2021
INVENTOR(S) : Zhou et al.

It is certified that error appears in the above-identified patent and that said Letters Patent is hereby corrected as shown below:

In the Claims

Claim 7: Column 24, Line 55: "frozen bits and the information bits in each segment;" should read -- frozen bits and the information bits in each segment; and --.

Signed and Sealed this
Second Day of August, 2022

Katherine Kelly Vidal
*Director of the United States Patent and Trademark Office*